United States Patent
Kodama et al.

(10) Patent No.: US 6,844,132 B2
(45) Date of Patent: Jan. 18, 2005

(54) POSITIVE PHOTOSENSITIVE COMPOSITIONS

(75) Inventors: Kunihiko Kodama, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 324 days.

(21) Appl. No.: 10/095,086

(22) Filed: Mar. 12, 2002

(65) Prior Publication Data

US 2003/0010748 A1 Jan. 16, 2003

(30) Foreign Application Priority Data

Mar. 12, 2001 (JP) ..................................... P.2001-069052

(51) Int. Cl.$^7$ ............................................. G03F 7/004
(52) U.S. Cl. ..................................... 430/270.1; 430/905
(58) Field of Search ............................. 430/270.1, 905

(56) References Cited

FOREIGN PATENT DOCUMENTS

| | | |
|---|---|---|
| EP | 1 041 442 A1 | 10/2000 |
| JP | 2000-275845 | 10/2000 |
| JP | 2000-292917 | 10/2000 |

OTHER PUBLICATIONS

Kodama et al., US 2003/0017415 A1, 1–23–2–03.*

* cited by examiner

*Primary Examiner*—Rosemary Ashton
(74) *Attorney, Agent, or Firm*—Sughrue Mion, PLLC

(57) ABSTRACT

A positive photosensitive composition comprising (A) a compound capable of generating a fluorine-substituted alkanesulfonic acid having 2 to 4 carbon atoms by irradiation of actinic rays or radiation, (B) a resin having a monocyclic or polycyclic alicyclic hydrocarbon structure and being decomposed by the action of an acid to increase solubility in an alkali developer, (C) a basic compound, and (D) a fluorine and/or silicon surfactant.

12 Claims, No Drawings

POSITIVE PHOTOSENSITIVE COMPOSITIONS

FIELD OF THE INVENTION

The present invention relates to a positive photosensitive composition used in the production process of semiconductor devices such as IC, in the production of circuit substrates for liquid crystals or thermal heads, or in other photofabrication processes. More specifically, the present invention pertains to a positive photosensitive composition suitable for use far ultraviolet rays of 250 nm or less as a light source for exposure.

BACKGROUND OF THE INVENTION

Chemically amplified positive resist compositions are materials for the formation of patterns on a substrate by generating an acid in the exposed area upon irradiation with radiation such as far ultraviolet rays, and differentiating a solubility in a developer between the exposed area and unexposed area by the reaction using the acid as a catalyst.

Since the compositions are mainly composed of a resin having as a basic skeleton, poly(hydroxystyrene) exhibiting small absorption in a region of 248 nm, good patterns with high sensitivity and high resolution are formed, when a KrF excimer laser is used as a light source for exposure. The compositions are therefore superior to conventional naphthoquinonediazide/novolac resin-based resist compositions.

When a shorter wavelength, e.g., ArF excimer laser (193 nm) is used as a light source for exposure, on the other hand, since an aromatic group-containing compound essentially exhibits large absorption in a region of 193 nm, the above-described chemically amplified compositions are still insufficient.

In *J. Vac. Sci. Technol.*, B9, 3357(1991), the use of poly(meth)acrylate as a polymer exhibiting small absorption in a wavelength range of 193 nm is described. The polymer is, however, accompanied with such a drawback as inferiority in the resistance to dry etching adopted ordinarily in a semiconductor production process to conventional aromatic group-containing phenolic resins.

A mixed acid generator of a specific sulfonium salt (an anion having 1 to 15 carbon atoms) and a triarylsulfonium salt is described in Japanese Patent Laid-Open No. 2000-292917, a combination of a triphenylsulfonium salt of a perfluoroalkanesulfonic acid having 4 to 8 carbon atoms and a 2-alkyl-2-adamantyl (meth)acrylate described in Japanese Patent Laid-Open No. 2000-275845, and a mixed acid generator of a specific sulfonium salt (an anion having 4 to 8 carbon atoms) and a triphenylsulfonium salt or iodonium salt of a perfluoroalkanesulfonic acid having 4 to 8 carbon atoms is described in EP1041442A.

It is the common practice to use modified illumination or a phase shift mask in order to satisfy a further miniaturization tendency of patterns. Annular illumination has been used for the formation of line and space patterns, while a halftone phase shift masks has been used for the formation of contact holes. When the halftone phase shift mask is used, however, the pattern portions are dissolved by a slight transmitted light, thereby causing a problem of sidelobe.

The p-hydroxystyrene resin using in a KrF excimer laser resist interacts with an acid generator, particularly, an ionic compound such as an onioum salt, thereby improving a solubility of the acid generator. A resin having an alicyclic hydrocarbon structure, on the other hand, does not readily cause interaction with an ionic compound such as an onium salt because of markedly high hydrophobicity so that solubility of the acid decreases. Such a resin therefore has a problem in that the resist solution tends to generate particles during storage.

In addition, conventional resist compositions are not advantageous because defocus latitude, i.e., fluctuation in line width due to defocus is accompanied.

SUMMARY OF THE INVENTION

An object of the present invention is therefore to provide a positive photosensitive composition, which exhibits high resolution upon the use of annular illumination, has wide defocus latitude, and hardly generates side lobe upon pattern formation through a halftone phase shift mask.

Another object of the invention is to provide a positive photosensitive composition hardly generating particles during the storage.

The above-described objects of the present invention can be accomplished by the positive photosensitive compositions having the following constitutions:

(1) A positive photosensitive composition comprising:
  (A) a compound capable of generating a fluorine-substituted alkanesulfonic acid having 2 to 4 carbon atoms by irradiation of actinic rays or radiation,
  (B) a resin having a monocyclic or polycyclic alicyclic hydrocarbon structure and being decomposed by the action of an acid to increase solubility in an alkali developer,
  (C) a basic compound, and
  (D) a fluorine and/or silicon surfactant.
(2) The positive photosensitive composition as described in (1) further comprising (E) a mixture of a hydroxyl-containing solvent and a hydroxyl-free solvent.
(3) The positive photosensitive composition as described in (1) or (2), wherein the resin (B) has a structural unit represented by the following formula (I) or (II):

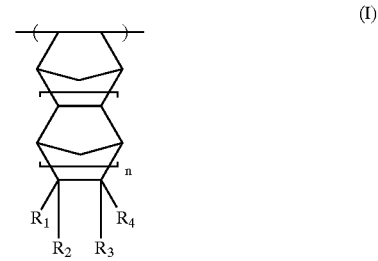

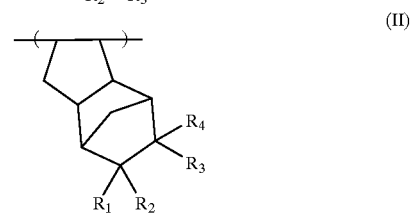

In formula (I) or (II), $R_1$ to $R_4$ each independently represents a hydrogen atom, a carboxyl group, a hydroxyl group, a substituted or unsubstituted alkyl group, a substituted or unsubstituted alkoxycarbonyl group or a group having an acid decomposable group; and n stands for 0 or 1.

(4) The positive photosensitive composition as described in any one of (1) to (3), wherein the resin (B) has a (meth)acrylate structural unit.

(5) The positive photosensitive composition as described in any one of (1) to (4), wherein the basic compound (C) is a compound having a structure selected from an imidazole structure, a diazabicyclo structure, an onium hydroxide structure and an onium carboxylate structure.

The positive photosensitive compositions of the invention exhibit high resolution upon the use of annular illumination, have wide defocus latitude, hardly generate sidelobe when patterns are formed through a halftone phase shift mask, and hardly generate particles during the storage.

DETAILED DESCRIPTION OF THE INVENTION

The positive photosensitive composition of the invention will be described in detail below.

<Acid Generator>

The acid generator used in the invention is a compound which generates a fluorine-substituted alkanesulfonic acid having 2 to 4 carbon atoms when exposed to actinic rays or radiation (the compound is also referred to as "Component (A)" or "sulfonic acid generator" hereinafter).

Examples of the fluorine-substituted alkanesulfonic acid having 2 to 4 carbon atoms include alkanesulfonic acids, e.g., ethanesulfonic acid, propanesulfonic acid, isopropanesulfonic acid, butanesulfonic acid, isobutanesulfonic acid or tert-butanesulfonic acid, wherein a part or all of the hydrogen atoms are substituted with fluorine atoms. Of these, those substituted at the α-position of the sulfonic acid moiety by a fluorine atom are preferred in view of sensitivity.

A fluorine-substituted alkanesulfonic acid having one carbon atom is not preferred since its excessively large diffusibility disorders the exposed latent image. Fluorine-substituted alkanesulfonic acids having 5 or more carbon atoms, on the other hand, have excessively small diffusibility and retards the progress of an acid catalyst reaction, thereby deteriorating sensitivity. Perfluoroalkanesulfonic acids having 8 or more carbon atoms are not preferred from the viewpoint of toxicity accumulated in a living body.

As Component (A) of the invention, sulfonium salts or iodonium salts of fluorine-substituted alkanesulfonic acids are preferred in view of sensitivity and resolution.

More preferred are the sulfonium salts, because they bring about a further improvement in storage stability.

As component (A) of the invention, sulfonium salts of perfluoroalkanesulfonic acids having 4 carbon atoms are especially preferred.

Preferred examples of the sulfonium salts include triarylsulfonium salts, phenacylsulfonium salts and alkylsulfonium salts having a 2-oxoalkyl group.

As Component (A) of the invention, compounds having a structure represented by any one of the following formulas (Ia) to (IIIa) are preferred.

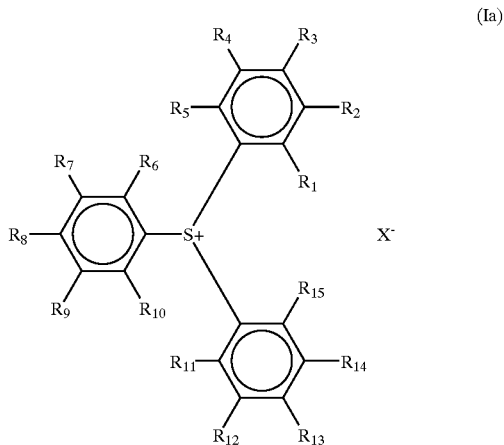

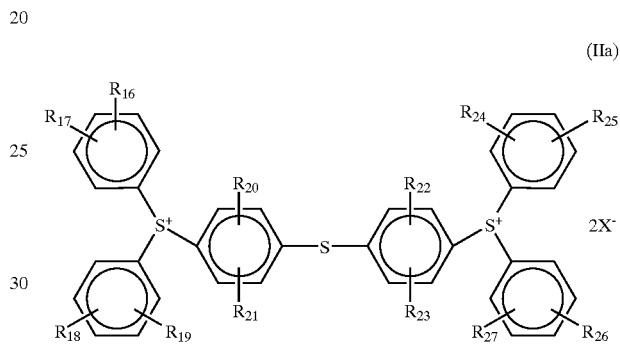

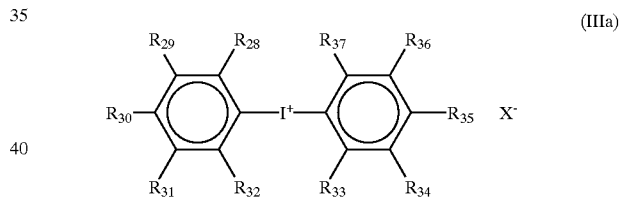

wherein, $R_1$ to $R_{37}$ each independently represents a hydrogen atom, a linear, branched or cyclic alkyl group, a linear, branched or cyclic alkoxy group, a hydroxy group, a halogen atom or a group —S—$R_{38}$ in which $R_{38}$ represents a linear, branched or cyclic alkyl group or an aryl group, and $X^-$ represents an anion of a fluorine-substituted alkanesulfonic acid having 2 to 4 carbon atoms.

As $R_1$ to $R_{38}$ in formulas (Ia) to (IIIa), examples of the linear or branched alkyl group include an alkyl group having 1 to 4 carbon atoms, e.g., methyl, ethyl, propyl, n-butyl, sec-butyl or tert-butyl group, which may be substituted.

Examples of the cycloalkyl group include a cycloalkyl group having 3 to 8 carbon atoms, e.g., cyclopropyl, cyclopentyl or cyclohexyl group, which may be substituted.

Examples of the alkoxy group for $R_1$ to $R_{37}$ include an alkoxy group having 1 to 4 carbon atoms, e.g., methoxy, ethoxy, hydroxyethoxy, propoxy, n-butoxy, isobutoxy, sec-butoxy or tert-butoxy group.

Examples of the halogen atom for $R_1$ to $R_{37}$ include fluorine, chlorine, bromine and iodine atoms.

Examples of the aryl group for $R_{38}$ include an aryl group having 6 to 14 carbon atoms, e.g., phenyl, tolyl, methoxyphenyl or naphthyl group. The aryl group may have a substituent.

Preferred examples of the substituent for the substituted groups include an alkoxy group having 1 to 4 carbon atoms, a halogen atom (fluorine, chlorine or iodine), an aryl group having 6 to 10 carbon atoms, an alkenyl group having 2 to 6 carbon atoms, a cyano group, a hydroxy group, a carboxyl group, an alkoxycarbonyl group and a nitro group.

The iodonium compounds or sulfonium compounds represented by formulas (Ia) to (IIIa) used in the invention have, as their counter anions X⁻, anions of the above-described fluorine-substituted alkanesulfonic acids.

The anion ($-SO_3^-$) is formed by removing a hydrogen atom of the sulfonic acid ($-SO_3H$).

Specific examples of Component (A) (including specific examples of the compounds represented by formulas (Ia) to (IIIa)) are shown below, but the invention is not limited thereto.

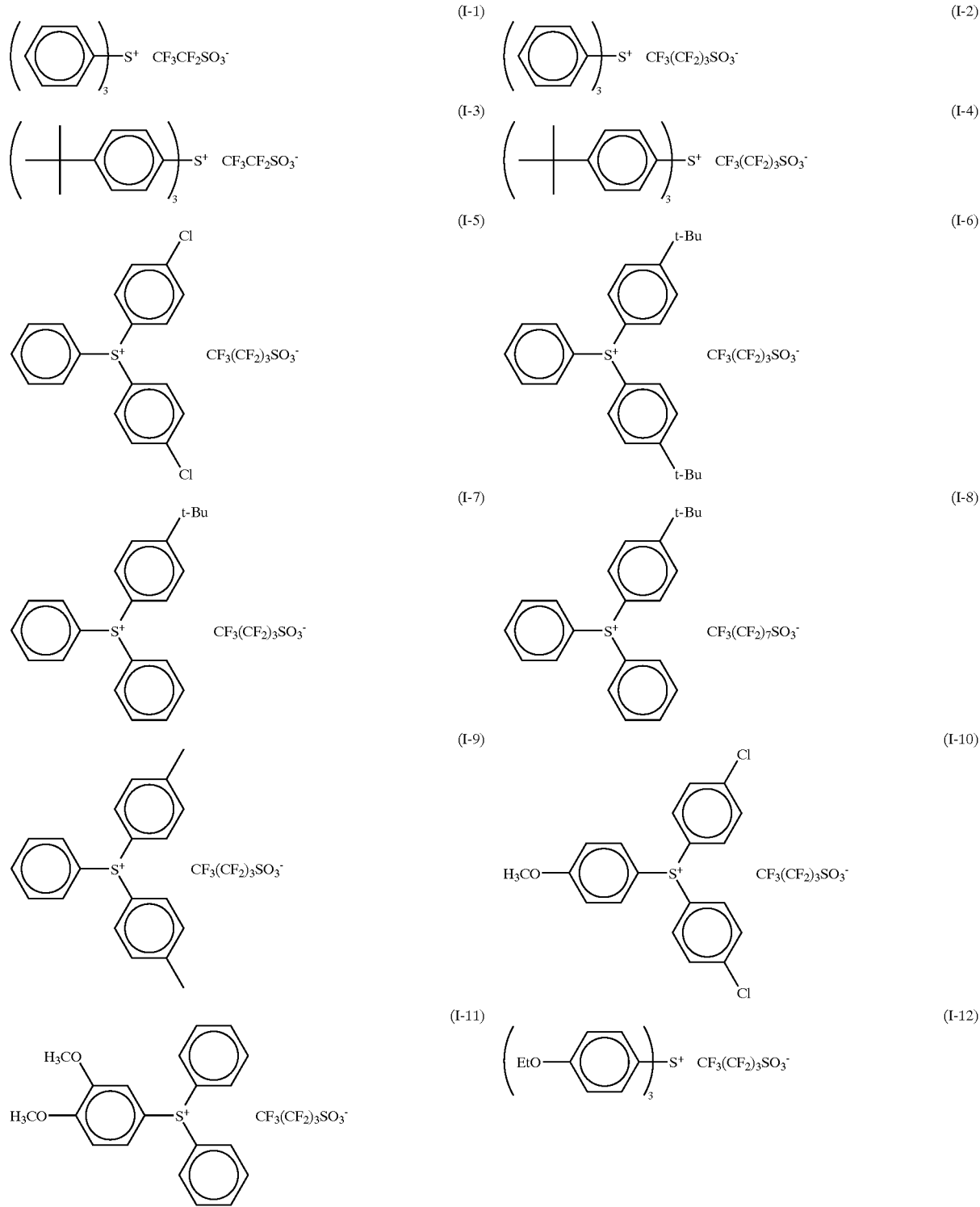

-continued
(I-13)
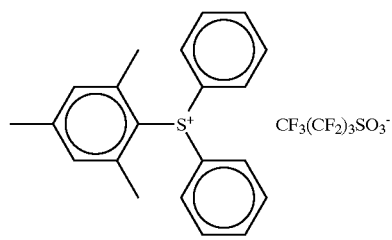
(I-14)
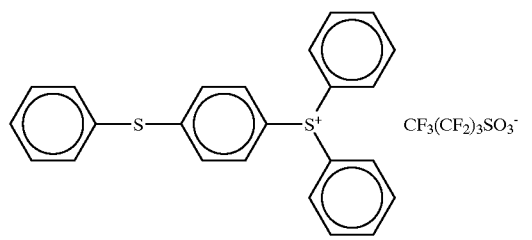
(I-15)
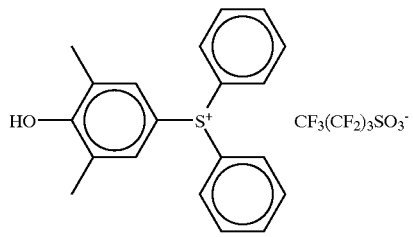
(I-16)
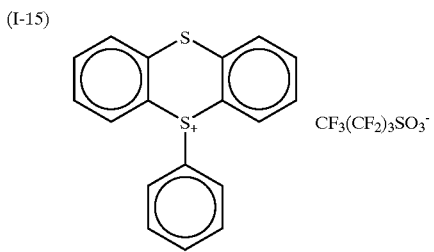
(I-17)
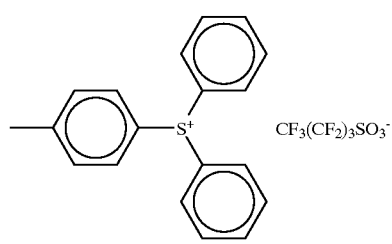
(I-18)
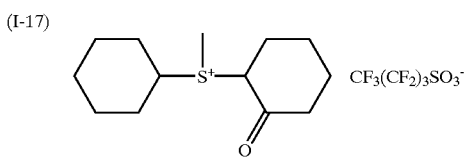
(I-19)
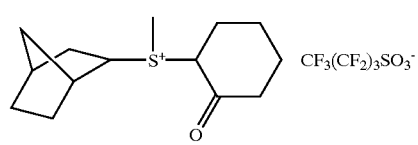
(I-20)
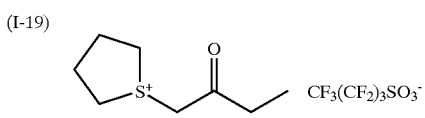
(I-21)
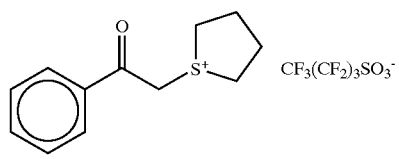
(II-1)
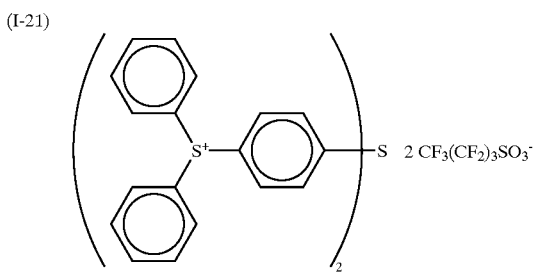
(II-2)
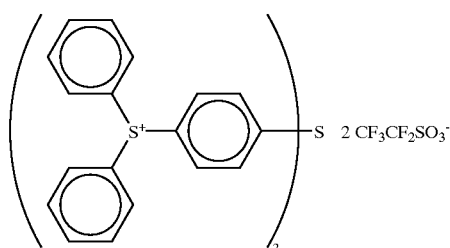
(II-3)
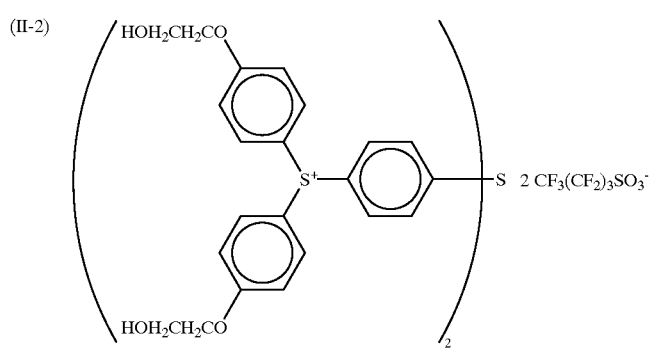
(III-1)
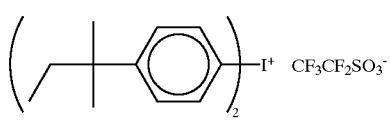
(III-2)
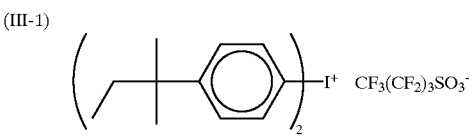

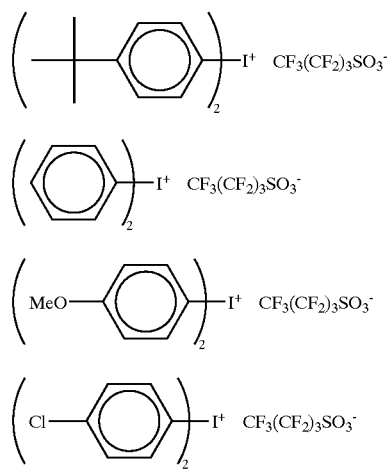
(III-3)

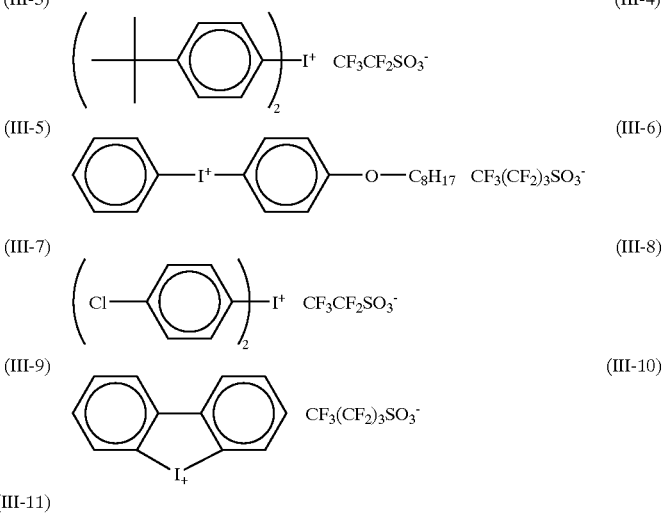
(III-4) (III-5) (III-6) (III-7) (III-8) (III-9) (III-10)

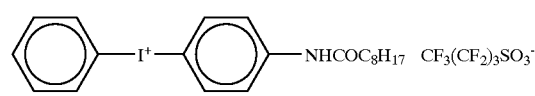
(III-11)

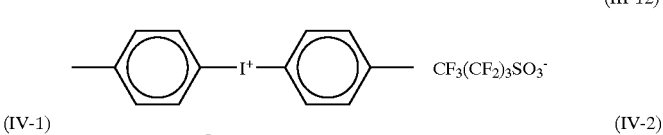
(III-12)

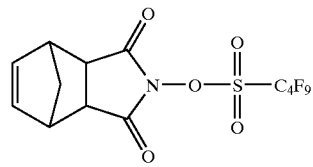
(IV-1)

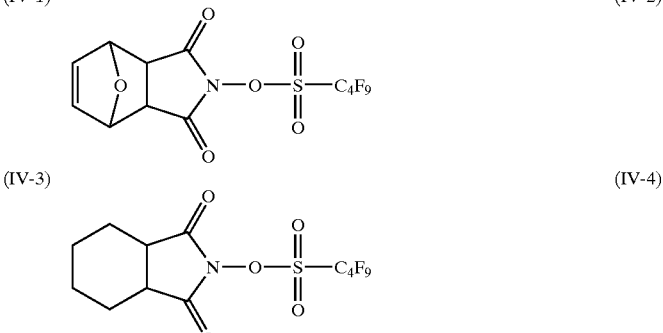
(IV-2) (IV-3) (IV-4)

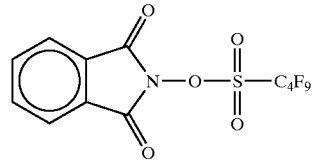
(V-1)

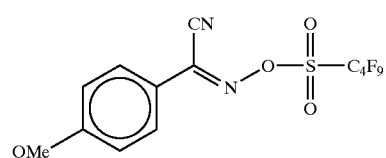
(V-2)

(VI-1)

(VI-2)

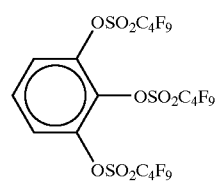

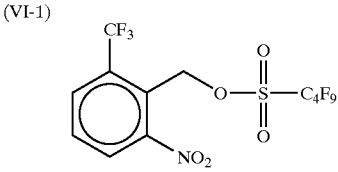

Compounds of Component (A) may be used singly or in combination.

When two or more thereof are used in combination, a combination of sulfonium salts different in the number of aromatic rings included therein is preferred, because this makes it possible to control film absorbance and an acid generation amount. Regarding the mixing ratio, an amount the sulfonium salt greater in the number of aromatic rings is preferably 50% by weight or less, more preferably 30% by weight or less, based on the total sulfonium salts.

The compound of formula (IIIa) serving as Component (A) can be synthesized by reacting an aromatic compound with a periodate and subjecting the resulting iodonium salt to salt exchange with a corresponding sulfonic acid.

The compound of the formula (Ia) or (IIa) can be synthesized, for example, by reacting an aryl Grignard reagent, e.g., an aryl magnesium bromide with a substituted or unsubstituted phenylsulfoxide and then subjecting the resulting triaryl sulfonium halide to salt exchange with a corresponding sulfonic acid.

It can also be synthesized by condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange; or condensing a diaryl iodonium salt with a diaryl sulfide in the presence of a catalyst, e.g., copper acetate and then subjecting the resulting condensate to salt exchange.

The salt exchange can be conducted by introduction once into a halide, followed by exchange to a sulfonate using a silver reagent, e.g., silver oxide, or by the use of an ion exchange resin. For the salt exchange, a sulfonic acid or sulfonate commercially available or obtained by hydrolysis of a commercially available sulfonic acid halide can be employed.

The use of compound represented by formula (IIIb) shown below as Component (A) is also preferred.

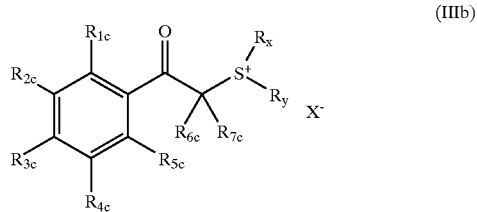

(IIIb)

wherein, $R_{1c}$ to $R_{5c}$ each independently represents a hydrogen atom, an alkyl group, an alkoxy group or a halogen atom;

$R_{6c}$ to $R_{7c}$ each independently represents a hydrogen atom, an alkyl group or an aryl group;

$R_x$ and $R_y$ each independently represents an alkyl group, a 2-oxoalkyl group, an alkoxycarbonylmethyl group, an allyl group or a vinyl group, or at least any two of $R_{1c}$ to $R_{7c}$, or $R_x$ and $R_y$ may be bonded each other to form a cyclic structure and the cyclic structure may contain an oxygen atom, a sulfur atom, an ester bond or an amido bond; and $X^-$ represents an anion of a fluorine-substituted alkanesulfonic acid having 2 to 4 carbon atoms.

The alkyl group for $R_{1c}$ to $R_{5c}$ may be a linear, branched or cyclic alkyl group, and includes an alkyl group having 1 to 10 carbon atoms. Preferred examples thereof include a linear or branched alkyl group having 1 to 5 carbon atoms (e.g., methyl, ethyl, linear or branched propyl, linear or branched butyl, or linear or branched pentyl) and a cyclic alkyl group having 3 to 8 carbon atoms (e.g., cyclopentyl or cyclohexyl).

The alkoxy group for $R_{1c}$ to $R_{5c}$ may be a linear, branched and cyclic alkoxy group, and includes an alkoxy group having 1 to 10 carbon atoms. Preferred examples thereof include a linear or branched alkoxy groups having 1 to 5 carbon atoms (e.g., methoxy, ethoxy, linear or branched propoxy, linear or branched butoxy, or linear or branched pentoxy) and a cyclic alkoxy group having 3 to 8 carbon atoms (e.g., cyclopentyloxy or cyclohexyloxy).

Preferably, any one of $R_{1c}$ to $R_{5c}$ represents a linear, branched or cyclic alkyl group or a linear, branched or cyclic alkoxy group, more preferably, $R_{1c}$ to $R_{5c}$ have 2 to 15 carbon atoms in total. This makes it possible to improve a solubility in a solvent, thereby suppressing generation of particles during storage.

The alkyl group for $R_{6c}$ and $R_{7c}$ is same as that for $R_{1c}$ to $R_{5c}$, and examples of the aryl group for $R_{6c}$ and $R_{7c}$ include an aryl group having 6 to 14 carbon atoms (e.g., phenyl).

The alkyl group for $R_x$ to $R_y$ is same as that for $R_{1c}$ to $R_{5c}$.

Examples of the 2-oxoalkyl group for $R_x$ to $R_y$ include groups having >C=O at the 2-position of the alkyl group for $R_{1c}$ to $R_{5c}$.

The alkoxy group of the alkoxycarbonylmethyl group is the same as that for $R_{1c}$ to $R_{5c}$.

Examples of the group formed by bonding $R_x$ and $R_y$ include butylene and pentylene groups.

$X^-$ represents an anion of a fluorine-substituted alkanesulfonic acid having 2 to 4 carbon atoms.

It is also preferred to use, as Component (A) of the invention, a salt having as a cation, a sulfonium represented by formula (IIc) shown below and as an anion, a fluorine-substituted alkanesulfonic acid anion having 2 to 4 carbon atoms.

(IIc)

wherein, $R^{1b}$ to $R^{3b}$ each independently represents an organic group containing no aromatic ring. The term "aromatic ring" as used herein includes an aromatic ring having a hetero atom.

The organic group containing no aromatic ring for $R^{1b}$ to $R^{3b}$ usually has 1 to 30 carbon atoms, and preferably has 1 to 20 carbon atoms.

$R^{1b}$ to $R^{3b}$ each independently represents preferably an alkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, and particularly preferably a linear or branched 2-oxoalkyl group.

The alkyl group for $R^{1b}$ to $R^{3b}$ may be a linear, branched or cyclic alkyl group. Preferred examples thereof include a linear or branched alkyl group having 1 to 10 carbon atoms (e.g., methyl, ethyl, propyl, butyl or pentyl) and a cyclic alkyl group having 3 to 10 carbon atoms (e.g., cyclopentyl, cyclohexyl or norbornyl).

The 2-oxoalkyl group for $R^{1b}$ to $R^{3b}$ may be a linear, branched or cyclic 2-oxoalkyl group. Preferred examples thereof include groups having >C=O at the 2-position of the alkyl group for $R^{1b}$ to $R^{3b}$.

The alkoxy group of the alkoxycarbonylmethyl group for $R^{1b}$ to $R^{3b}$ is preferably an alkoxy group having 1 to 5 carbon atoms (e.g., methoxy, ethoxy, propoxy, butoxy or pentyloxy).

The group for $R^{1b}$ to $R^{3b}$ may be substituted further with a halogen atom, an alkoxy group (e.g., an alkoxy group having 1 to 5 carbon atoms), a hydroxyl group, a cyano group or a nitro group.

Two of $R^{1b}$ to $R^{3b}$ may be bonded to form a cyclic structure and the cyclic structure may contain, in the ring thereof, an oxygen atom, a sulfur atom, an ester bond, an amido bond or a carbonyl group. Examples of the group formed by bonding two of $R^{1b}$ to $R^{3b}$ include an alkylene group (e.g., butylene or pentylene).

It is preferred from the viewpoint of photoreactivity that any one of $R^{1b}$ to $R^{3b}$ has a carbon-carbon double bond or carbon-oxygen double bond.

At least one of $R^{1b}$ to $R^{3b}$ of one compound represented by formula (IIc) may be bonded to at least one of $R^{1b}$ to $R^{3b}$ of another compound represented by formula (IIc).

The content of the compound serving as Component (A) in the positive photosensitive composition of the invention is preferably 0.1 to 20% by weight, more preferably 0.5 to 10% by weight, and still more preferably 1 to 7% by weight, based on the solid content of the composition.

<Acid Generating Compound Used in Combination with the Acid Generator of Component (A)>

In the invention, a compound which is decomposed by exposure to actinic rays or radiation to generate an acid may be used in combination with the acid generator of Component (A).

A molar ratio of Component (A) of the invention to other photoacid generator used in combination therewith (Component (A)/other acid generator) usually ranges 100/0 to 20/80, preferably 100/0 to 40/60, and more preferably 100/0 to 50/50.

Such a photoacid generator is appropriately selected from photoinitiators for photo cationic polymerization, photoinitiators for photo radical polymerization, photodecolorizers for dyes, photo discoloring agents, known compounds which are capable of generating acids upon exposure to actinic rays or radiation used for micro resists, and mixtures thereof.

Specific examples of the photoacid generator include onium salts, e.g., diazonium salts, ammonium salts, phosphonium salts, iodonium salts, sulfonium salts, selenonium salts or arsonium salts, organic halogen compounds, organic metal/organic halide compounds, photoacid generators having an o-nitrobenzyl protecting group, compounds generating a sulfonic acid by photolysis including typically an iminosulfonate, and disulfone compounds.

It is also possible to use polymer compounds having in the main chain or side chain thereof a group or compound capable of generating an acid by exposure to actinic rays or radiation, for example, compounds as described in U.S. Pat. No. 3,849,137, German Patent 3914407, and Japanese Patent Laid-Open Nos. 26653/1988, 164824/1980, 69263/1987, 146038/1988, 163452/1988, 153853/1987 and 146029/1988.

Compounds generating an acid as described in U.S. Pat. No. 3,779,778 and European Patent 126,712 are also used.

Among the above-described compounds, which are decomposed by exposure to active rays or radiation to generate an acid, used in combination, those particularly effective are described in detail below.

(1) Oxazole derivatives substituted with a trihalomethyl group represented by formula (PAG1) shown below or S-triazine derivatives substituted with a trihalomethyl group represented by formula (PAG2) shown below.

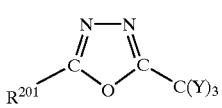
(PAG1)

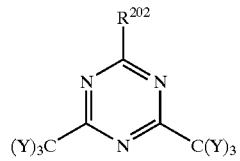
(PAG2)

In the formulas, $R^{201}$ represents a substituted or unsubstituted aryl or a substituted or unsubstituted alkenyl group, $R^{202}$ represents a substituted or unsubstituted aryl group, a substituted or unsubstituted alkenyl group, a substituted or unsubstituted alkyl group, or $-C(Y)_3$, and Y represents a chlorine atom or a bromine atom.

Specific examples thereof are described below, but the invention is not limited thereto.

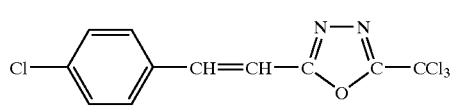
(PAG1-1)

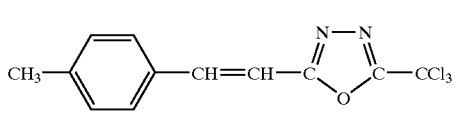
(PAG1-2)

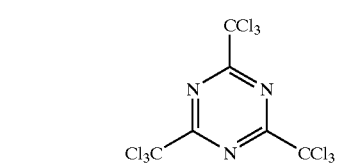
(PAG2-1)

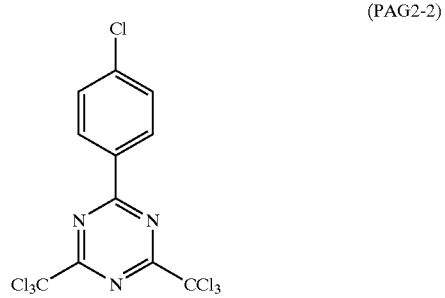
(PAG2-2)

(2) Iodonium salts represented by formula (PAG3) shown below or sulfonium salts represented by formula (PAG4) shown below.

(PAG3)

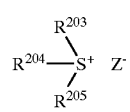
(PAG4)

In the formulas, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents a substituted or unsubstituted alkyl or a substituted or unsubstituted aryl group, preferably an aryl group having 6 to 14 carbon atoms, an alkyl group having 1 to 8 carbon atoms or a substituted derivative thereof. Preferred examples of the substituent for the aryl group include an alkoxy group having 1 to 8 carbon atoms, an alkyl group having 1 to 8 carbon atoms, a nitro group, a carboxyl group, a hydroxy group and a halogen atom. Preferred examples of the substituent for the alkyl group include an alkoxy group having 1 to 8 carbon atoms, a carboxyl group and an alkoxycarbonyl group.

$Z^-$ represents a counter anion. Examples thereof include $BF_4^-$, $AsF_6^-$, $PF_6^-$, $SbF_6^-$, $SiF_6^{2-}$, $ClO_4^-$, a perfluoroalkane sulfonic anion, e.g., $CF_3SO_3^-$ (excepting those having 2 to 4 carbon atoms), a pentafluolobenzenesulfonic anion, a condensed polynuclear aromatic sulfonic anion, e.g., naphthalene-1-sulfonic anion, an anthraquinone sulfonic anion and a dye containing a sulfonic acid, but the invention is not limited Two of $R^{203}$, $R^{204}$ and $R^{205}$, or $Ar^1$ and $Ar^2$ may be bonded with each other via a single bond or a substituent.

Specific examples thereof are described below, but the invention is not limited thereto.

The below-described compounds are typical examples but the present invention is not limited thereto.

(PAG3-1)
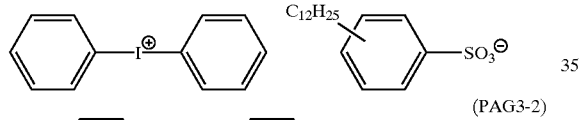

(PAG3-2)
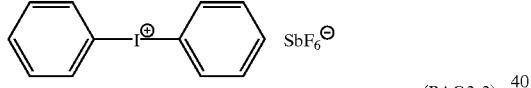

(PAG3-3)
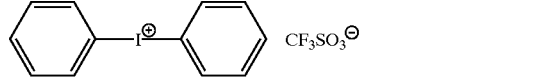

(PAG3-4)
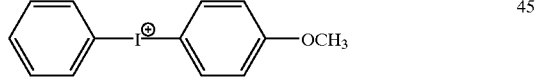

(PAG3-5)
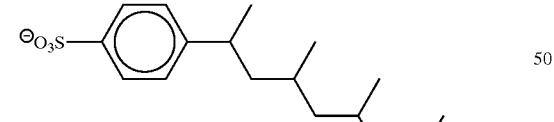

(PAG3-6)
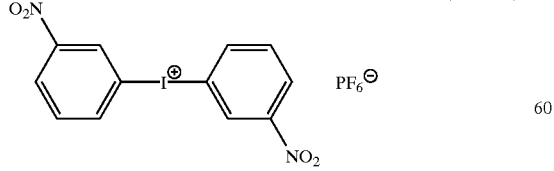

(PAG3-7)
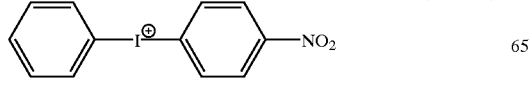

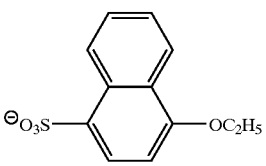

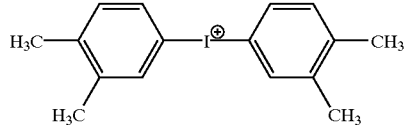

(PAG3-8)
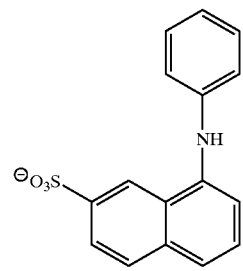

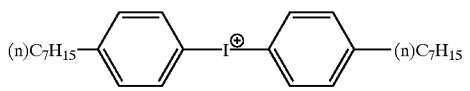

(PAG3-9)
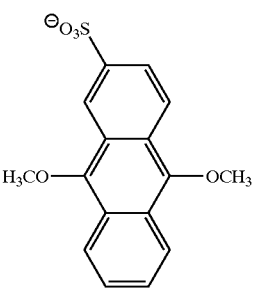

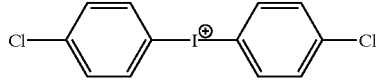

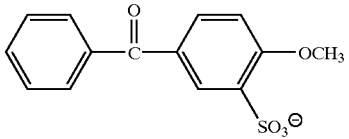

(PAG3-10)
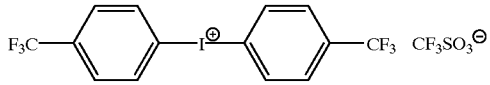

(PAG3-11)
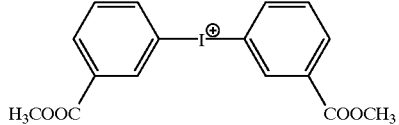

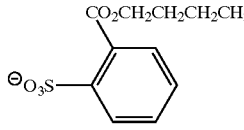

(PAG3-12)
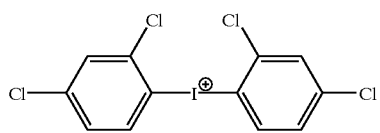
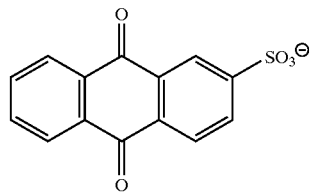
(PAG3-13)
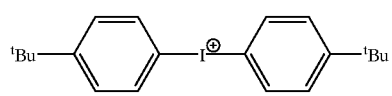
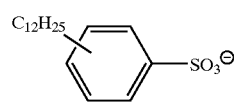
(PAG3-14)
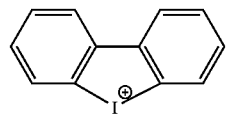
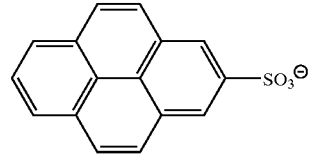
(PAG3-15)
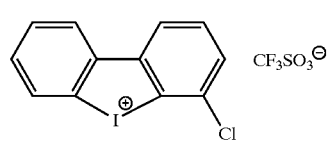
(PAG3-16)
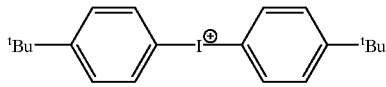
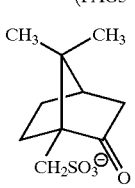
(PAG3-17)
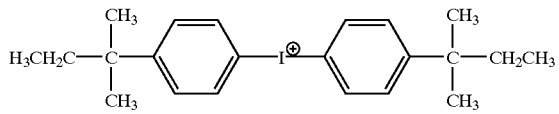
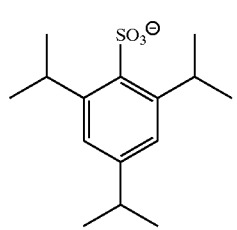
(PAG3-18)
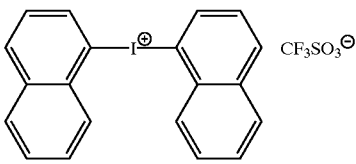
(PAG3-21)
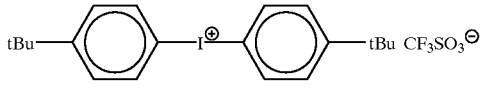
(PAG3-22)
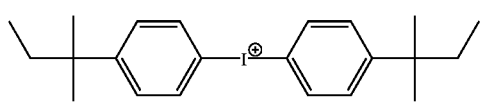
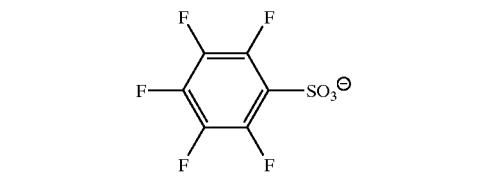
(PAG4-1)
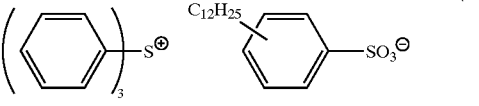
(PAG4-2)
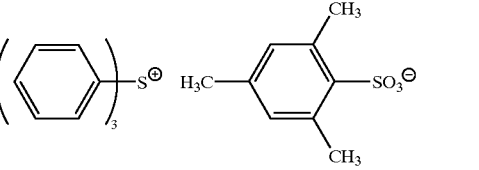
(PAG4-3)
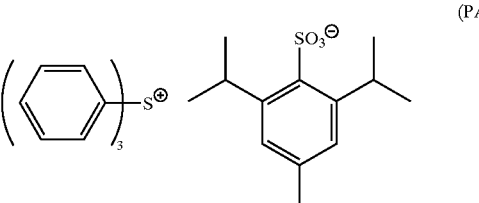
(PAG4-4)
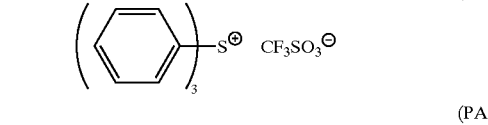
(PAG4-5)
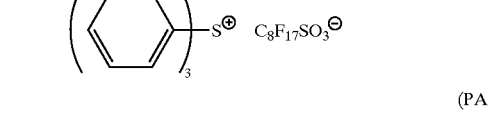
(PAG4-7)
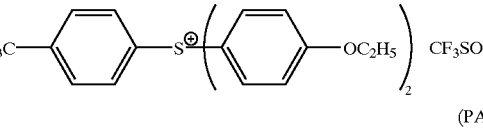
(PAG4-8)
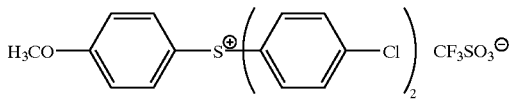

-continued
(PAG4-9)
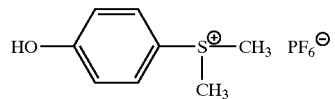
(PAG4-10)
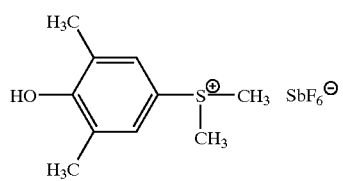
(PAG4-11)
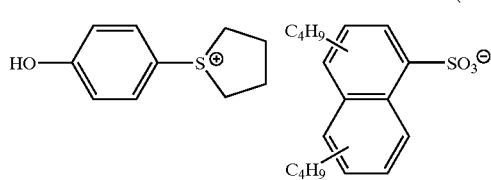
(PAG4-12)
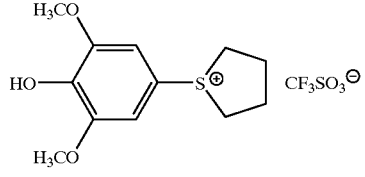
(PAG4-13)
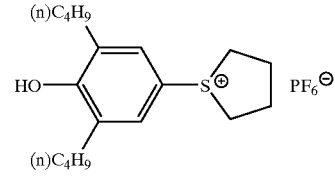
(PAG4-14)
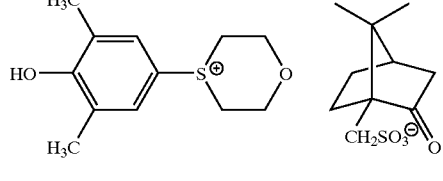
(PAG4-15)
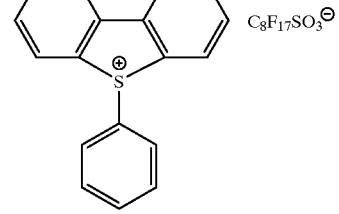
(PAG4-16)
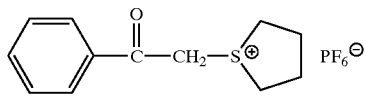
(PAG4-17)
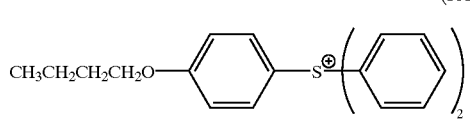
(PAG4-18)
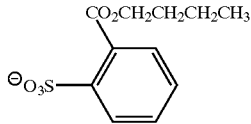
(PAG4-19)
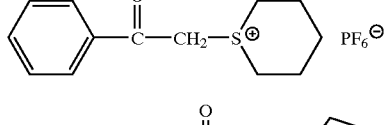
(PAG4-20)
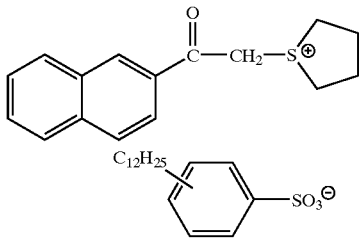
(PAG4-21)
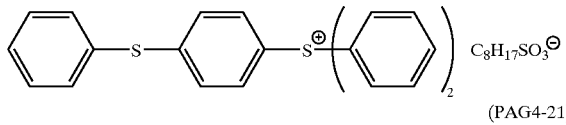
(PAG4-22)
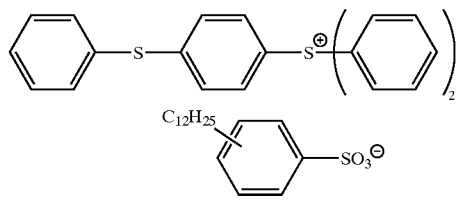
(PAG4-23)
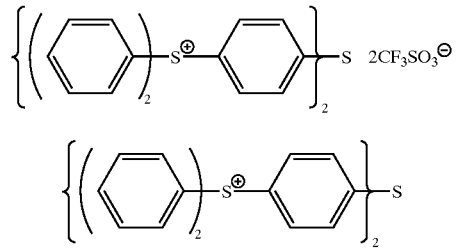
(PAG4-24)
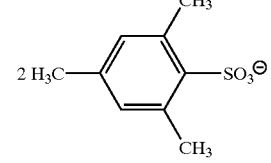
(PAG4-27)
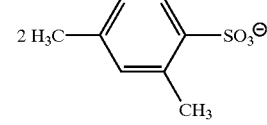

(PAG4-29)
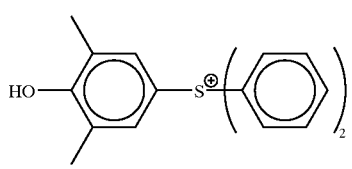

(PAG4-30)
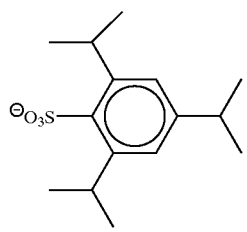

(PAG4-31)
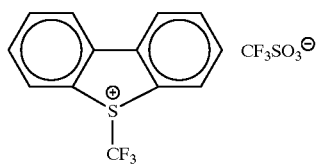

(PAG4-33)
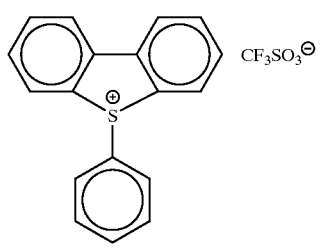

(PAG4-34)
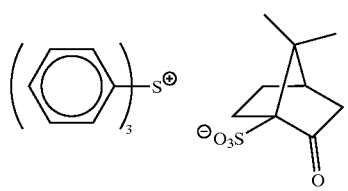

(PAG4-36)
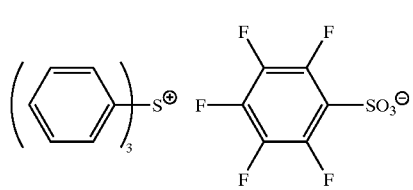

(PAG4-37)
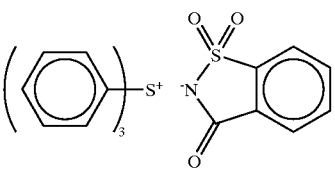

(PAG4-38)
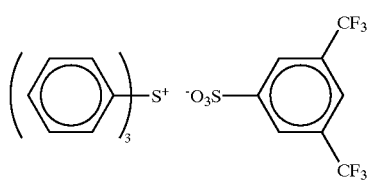

The onium salts represented by formulae (PAG3) and (PAG4) are known and can be synthesized, for example, by methods as described in U.S. Pat. Nos. 2,807,648 or 4,247,473, and Japanese Patent Laid-Open No. 101,331/1978.

(3) Disulfone derivatives represented by formula (PAG5) and iminosulfonate derivatives represented by formula (PAG6).

$$Ar^3\text{—}SO_2\text{—}SO_2\text{—}Ar^4 \quad \text{(PAG5)}$$

(PAG6)
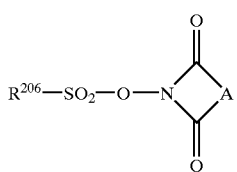

In the formulas, $Ar^3$ and $Ar^4$ each independently represents a substituted or unsubstituted aryl group, $R^{206}$ represents a substituted or unsubstituted alkyl or a substituted or unsubstituted aryl group, and A represents a substituted or unsubstituted alkylene group, a substituted or unsubstituted alkenylene group or a substituted or unsubstituted arylene group.

Specific examples thereof are described below, but the invention is not limited thereto.

(PAG5-1)
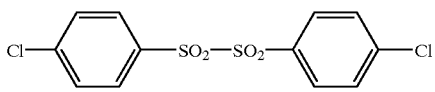

(PAG5-2)
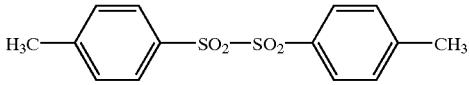

(PAG5-3)
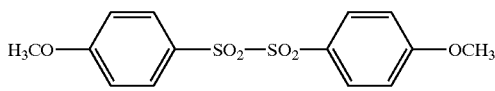

(PAG5-4)
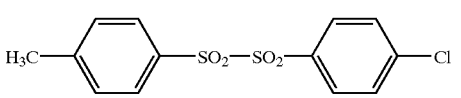

(PAG5-5)
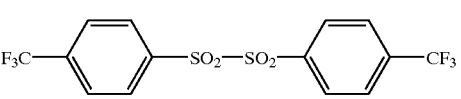

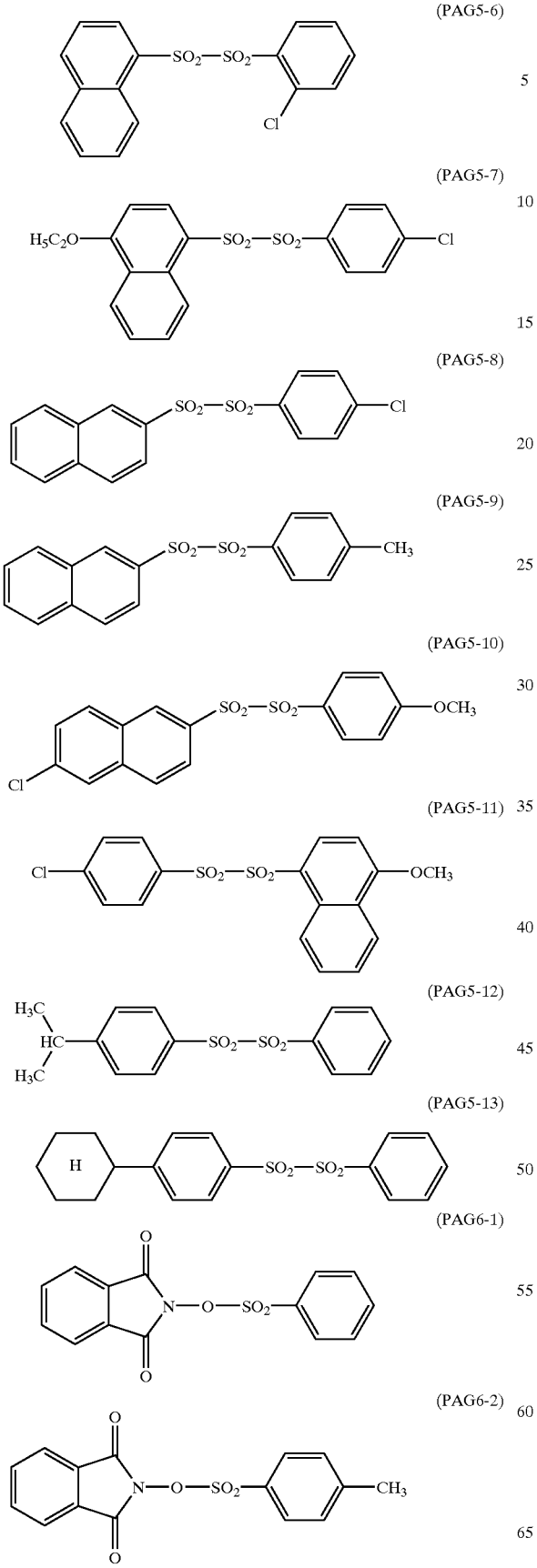

(PAG6-11)

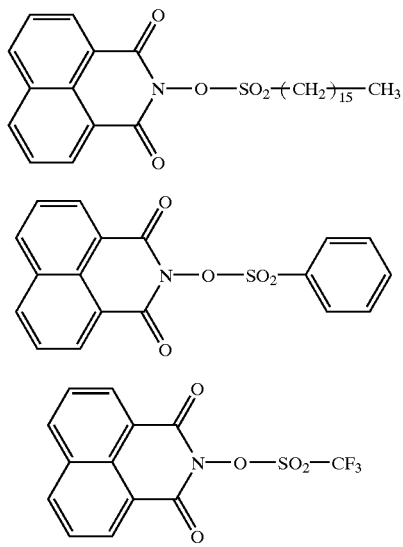

(PAG6-12)

(PAG6-13)

(4) Diazodisulfone derivatives represented by formula (PAG7).

(PAG7)

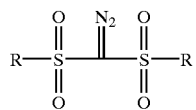

In the formula, R represents a linear, branched or cyclic alkyl group or an aryl group which may be substituted.

Specific examples thereof are described below, but the invention is not limited thereto.

(PAG7-1)
(PAG7-2)
(PAG7-3)
(PAG7-4)
(PAG7-5)

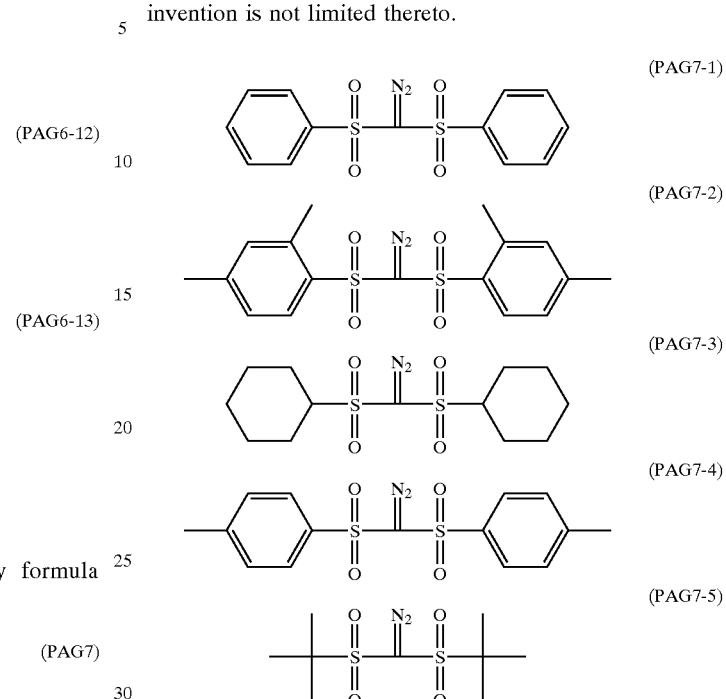

Particularly preferred examples of the acid generator used in combination in the invention include:

(e1)

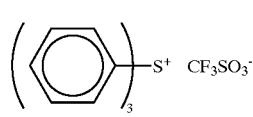

(e2)

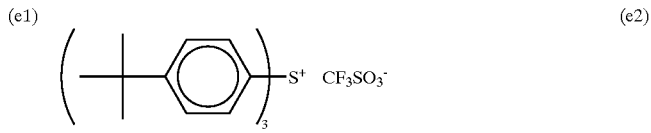

(e3)

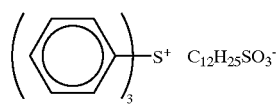

(e4)

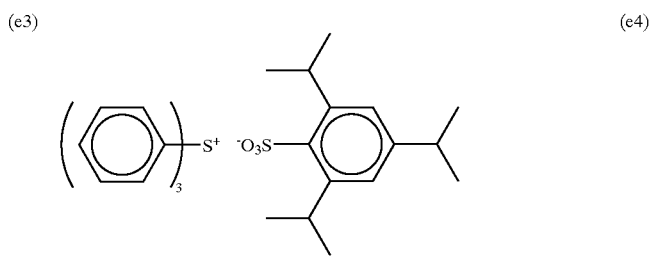

(e5)

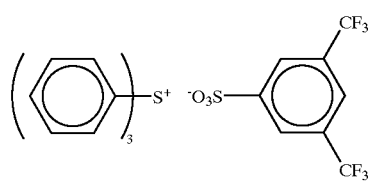

(e6)

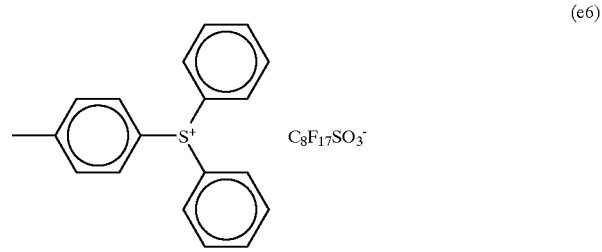

(e7)

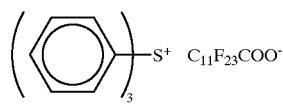

(e8)

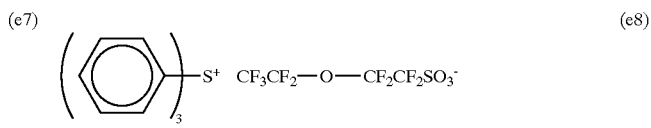

-continued
(e9)
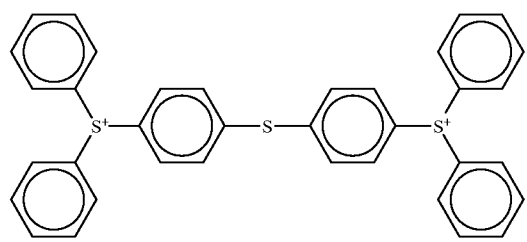
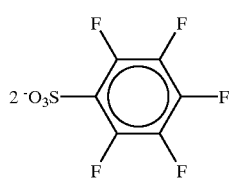
(e10)
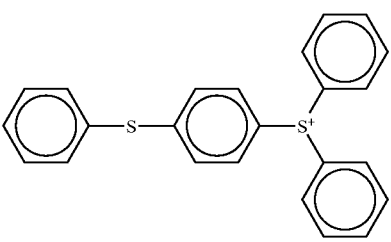
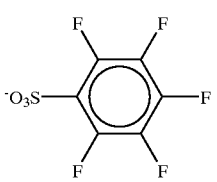
(e11)
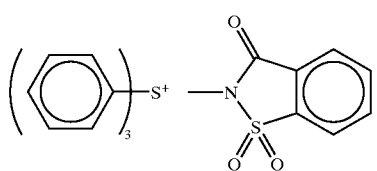
(e12)
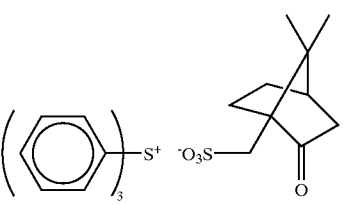
(e13)
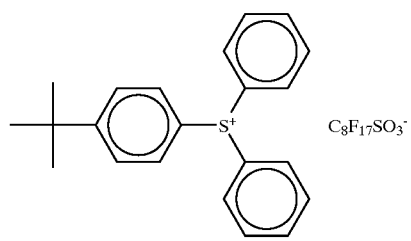
(e14)
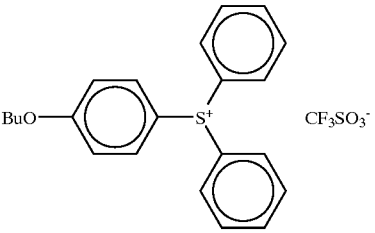
(e15)
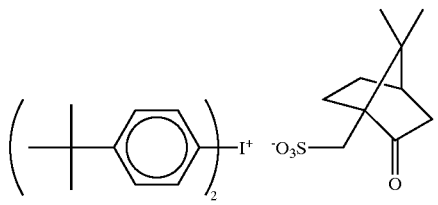
(e16)
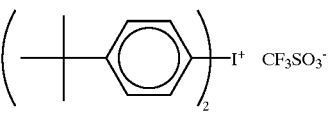
(e17)
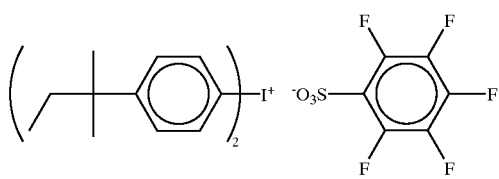
(e18)
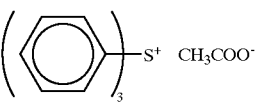
(e19)
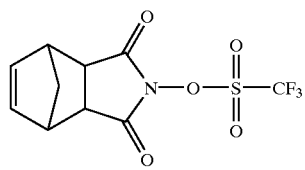
(e20)
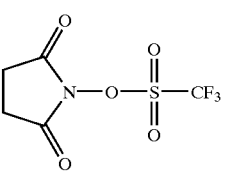
(e21)
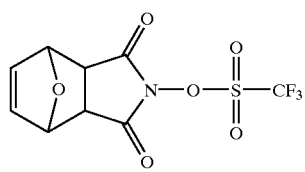
(e22)
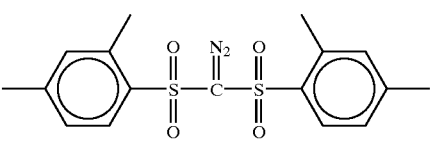

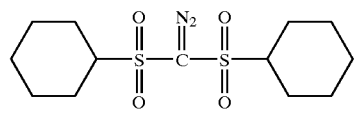
(e23)

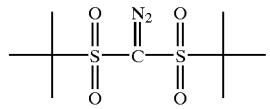
(e24)

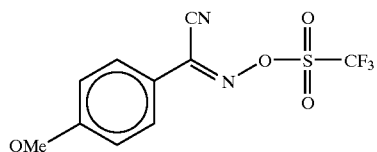
(e25)

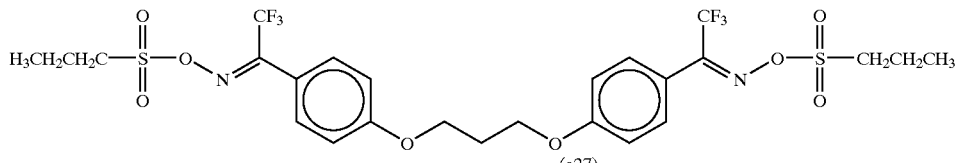
(e26)

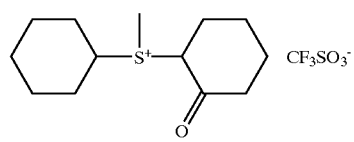
(e27)

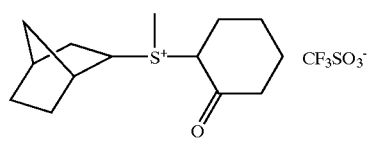
(e28)

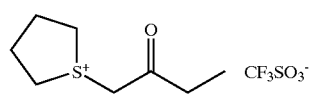

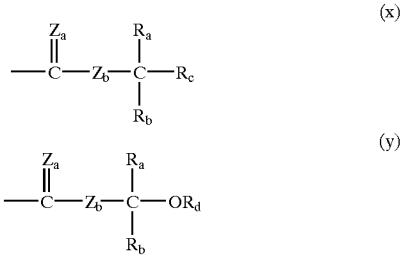
(e29)

<(B) Resin being Decomposed by the Action of an Acid to Increase Solubility in an Alkali Developer>

In the invention, the resin (B) being decomposed by the action of an acid to increase solubility in an alkali developer (hereinafter also referred to as "acid decomposable resin") has a group decomposable by the action of an acid.

Examples of the group decomposable by the action of an acid (hereinafter also referred to as "acid decomposable group") include a group which is hydrolyzed by the action of an acid, thereby forming an acid and a group which release a carbon cation by the action of an acid, thereby forming an acid. Preferred examples thereof include groups represented by formulas (x) and (y) shown below, acid decomposable groups having a lactone structure and acid decomposable groups having an alicyclic structure. Such groups contribute to improve the preservation stability.

$$\overset{Z_a}{\underset{\parallel}{C}}-Z_b-\overset{R_a}{\underset{R_b}{\overset{|}{C}}}-R_c \qquad (x)$$

$$\overset{Z_a}{\underset{\parallel}{C}}-Z_b-\overset{R_a}{\underset{R_b}{\overset{|}{C}}}-OR_d \qquad (y)$$

In the formulas, $R_a$, $R_b$ and $R_c$ each independently represents a hydrogen atom, an alkyl group which may have a substituent, a cycloalkyl group which may have a substituent or an alkenyl group which may have a substituent, with the proviso that at least one of $R_a$, $R_b$ and $R_c$ in formula (x) represents a group other than a hydrogen atom. $R_d$ represents an alkyl group which may have a substituent, a cycloalkyl group which may have a substituent or an alkenyl group which may have a substituent. Two of $R_a$, $R_b$ and $R_c$ in formula (x) or two of $R_a$, $R_b$ and $R_d$ in formula (y) may be bonded to each other to form a cyclic structure having 3 to 8 carbon atoms and the cyclic structure may contain a hetero atom. Specific examples of such a ring include cyclopropyl, cyclopentyl, cyclohexyl, cycloheptyl, 1-cyclohexenyl, 2-tetrahydrofuranyl and 2-tetrahydropyranyl rings.

$Z_a$ and $Z_b$ each independently represents an oxygen atom or a sulfur atom.

The alkyl group for $R_a$ to $R_d$ includes preferably an alkyl group having 1 to 8 carbon atoms which may have a substituent, e.g., methyl, ethyl, propyl, n-butyl, sec-butyl, hexyl, 2-ethylhexyl or octyl group. The cycloalkyl group includes preferably a cycloalkyl group having 3 to 8 carbon atoms which may have a substituent, e.g., cyclopropyl, cyclopentyl or cyclohexyl group. The alkenyl group include an alkenyl group having 2 to 6 carbon atoms which may have a substituent, e.g., vinyl, propenyl, allyl, butenyl, pentenyl, hexenyl or cyclohexenyl group.

Preferred examples of the substituent for the substituents described above include a hydroxyl group, a halogen atom (e.g., fluorine, chlorine, bromine or iodine), a nitro group, a cyano group, an amid group, a sulfonamid group, an alkyl group, e.g., methyl, ethyl, propyl, n-butyl, sec-butyl, hexyl, 2-ethylhexyl or octyl group, an alkoxy group, e.g., methoxy, ethoxy, hydroxyethoxy, propoxy, hydroxypropoxy or butoxy group, an alkoxycarbonyl group, e.g., methoxycarbonyl or ethoxycarbonyl group, an acyl group, e.g., formyl, acetyl or benzoyl group, an acyloxy group, e.g., acetoxy or butyryloxy group, and a carboxy group.

Specific examples of the recurring unit having the acid decomposable group are described below, but the invention is not limited thereto.

(c1) 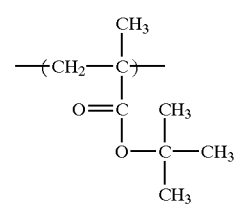
(c2) 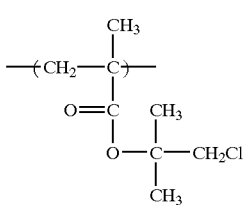
(c3) 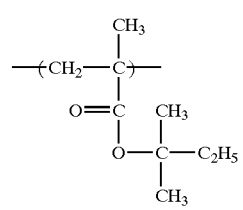
(c4) 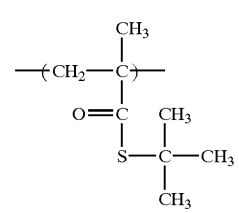
(c5) 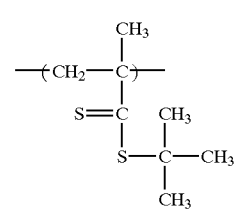
(c6) 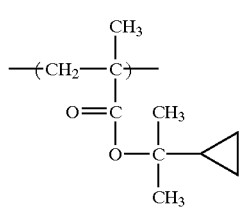
(c7) 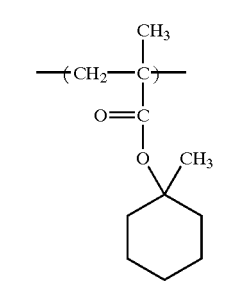
-continued
(c8) 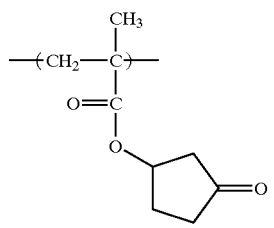
(c9) 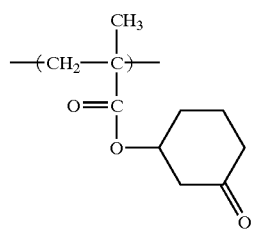
(c10) 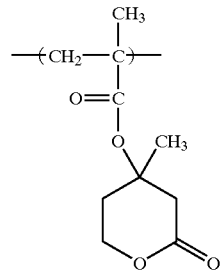
(c11) 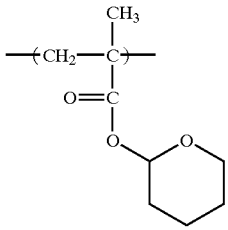
(c12) 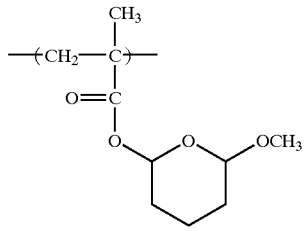
(c13) 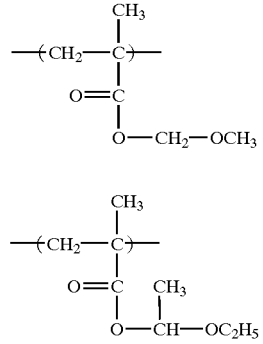
(c14)

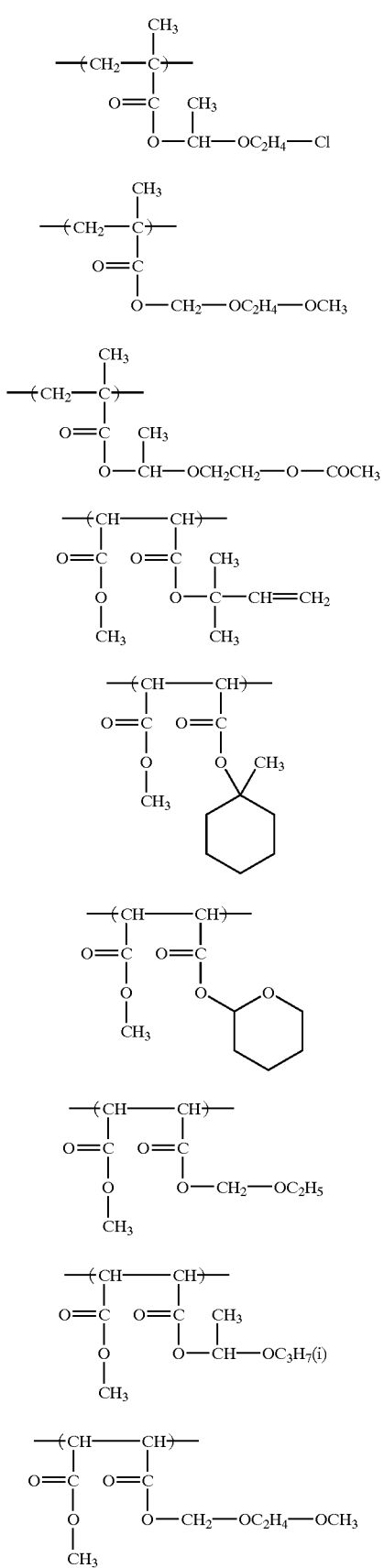

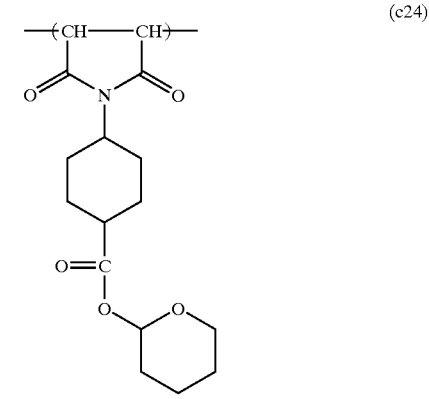

Of the above-described recurring units, (c1), (c7) and (c11) are particularly excellent in acid decomposability.

In the invention, the acid decomposable resin preferably contains a lactone structure.

The lactone structure present in the side chain of the resin is preferred. Specific examples of the recurring unit having a lactone structure in the side chain include recurring units (a1) to (a20) shown below.

As described above, the alicyclic hydrocarbon structure and lactone structure may or may not have acid decomposability.

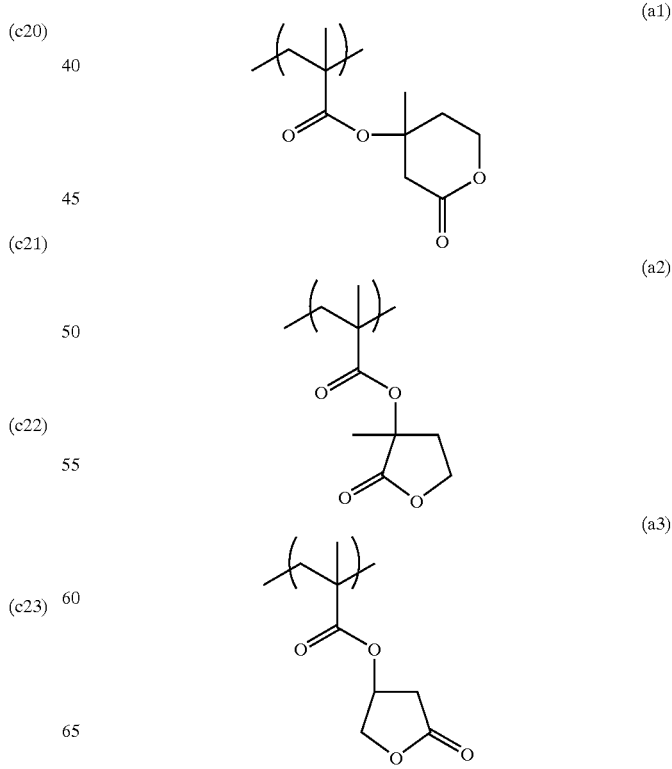

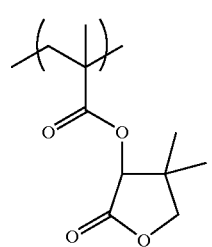 (a4)
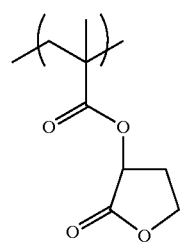 (a5)
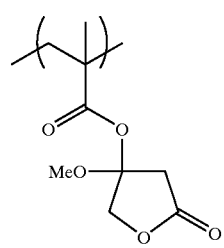 (a6)
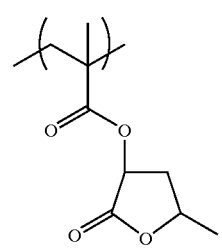 (a7)
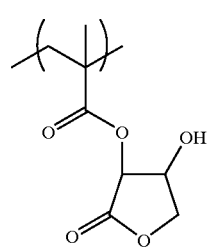 (a8)
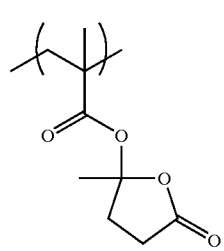 (a9)
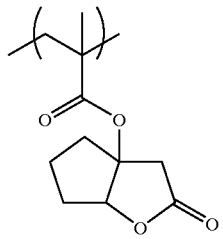 (a10)
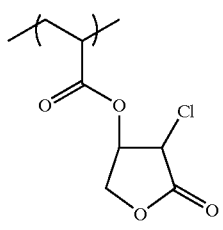 (a11)
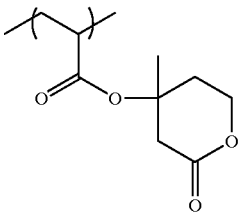 (a12)
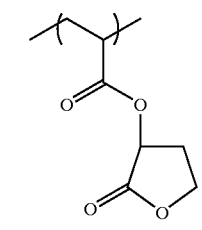 (a13)
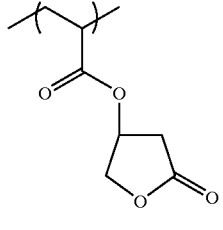 (a14)
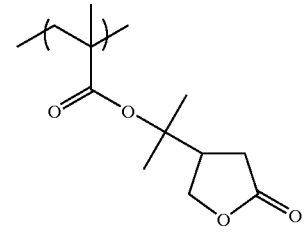 (a15)
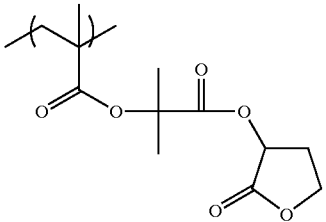 (a16)

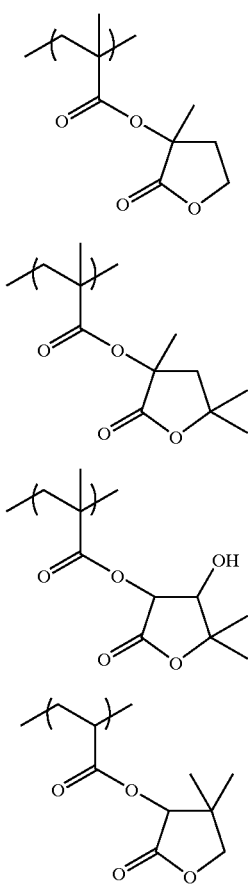

(a17)

(a18)

(a19)

(a20)

Of the above-described recurring units (a1) to (a20), (a1), (a12) and (a15) are preferred because they usually exhibit the acid decomposability.

Of the monocyclic or polycyclic alicyclic hydrocarbon structure incorporated into the acid decomposable resin, the monocyclic alicyclic hydrocarbon structure includes a group having a monocyclic alicyclic skeleton having 3 carbon atoms or more, preferably 3 to 8 carbon atoms, and specifically, an alicyclic hydrocarbon skeleton, e.g., cyclopropane, cyclobutane, cyclopentane or cyclohexane. The polycyclic alicyclic hydrocarbon structure includes a group having an alicyclic skeleton having 5 carbon atoms or more, preferably 7 to 25 carbon atoms, and specifically, an alicyclic hydrocarbon skeleton, e.g., bicyclo, tricyclo or tetracyclo skeleton. More specific examples include those exemplified in the structures described hereinafter.

The acid decomposable group, which may be incorporated into the alicyclic hydrocarbon group, may be bonded in the form of an acid decomposable structure and decomposed by the action of an acid to release the alicyclic hydrocarbon group, or may be the group represented by formula (x) or (y) bonded to the alicyclic hydrocarbon group directly or via a connecting group.

When the resin has, on the side chain thereof, the monocyclic or polycyclic alicyclic hydrocarbon group, it is preferred that the main chain of the resin is bonded to the alicyclic hydrocarbon group via a tertiary ester group.

The structural units represented by formulas (IId) to (Vd) shown below are preferred as the recurring units having a monocyclic or polycyclic alicyclic hydrocarbon structure.

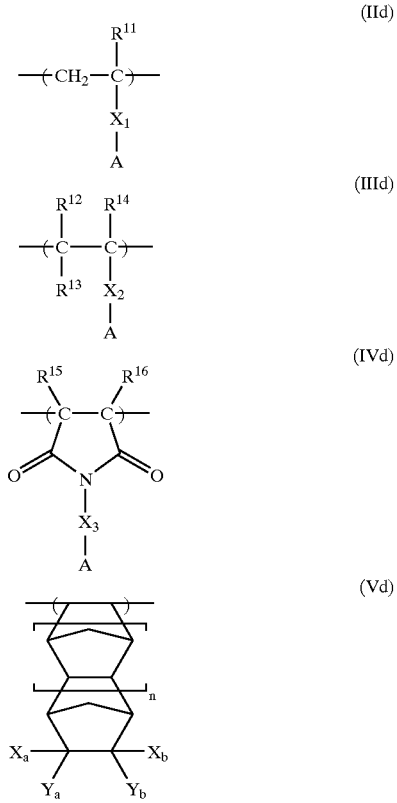

First, the explanations on formulas (IId) to (IVd) are made, and then those on formula (Vd) are made.

In formulas (IId) to (IVd), the substituents bonded to the main chain of the recurring unit, that is, $R^{11}$, $R^{12}$ and $R^{14}$ to $R^{16}$ each independently represents a hydrogen atom, a halogen atom, a cyano group, an alkyl group or a haloalkyl group. $R^{11}$, $R^{12}$ and $R^{14}$ to $R^{16}$ may be the same or different.

Examples of the alkyl group represented by each of $R^{11}$, $R^{12}$ and $R^{14}$ to $R^{16}$ include a hydrocarbon group having from 1 to 4 carbon atoms, e.g., methyl, ethyl, propyl, n-butyl or sec-butyl.

Examples of the haloalkyl group include alkyl groups having 1 to 4 carbon atoms wherein a part or all of the hydrogen atoms are substituted with halogen atoms. Fluorine, chlorine and bromine atoms are preferred as the halogen atom. Specific examples of the haloalkyl group include fluoromethyl, chloromethyl, bromomethyl, fluoroethyl, chloroethyl and bromoethyl.

The alkyl and haloalkyl groups may each have a substituent other than the halogen atom.

The substituent R represents a cyano group, —CO—$OR^{23}$ or —CO—$NR^{24}R^{25}$.

In the above-described formula, $R^{23}$ represents a hydrogen atom, an alkyl group, a cycloalkyl group, an alkenyl group or an acid decomposable group. Examples of the acid decomposable group include those described above. For example, compounds having the recurring structural unit as described above are preferred. Of the groups for $R^{23}$, the alky, cycloalkyl and alkenyl group may further have a substituent.

In the above-described formula, $R^{24}$ and $R^{25}$ each represents a hydrogen atom, an alkyl group, a cycloalkyl group or an alkenyl group. The alkyl, cycloalkyl or alkenyl group may have a substituent. $R^{24}$ and $R^{25}$ may be the same or different. $R^{24}$ and $R^{25}$ may be bonded to each other to form a ring together with the nitrogen atom. The ring formed is preferably a 5- to 8-membered ring and includes specifically pyrrolidine, piperidine and piperazine skeletons.

The alkyl group represented by any one of $R^{23}$ to $R^{25}$ includes preferably an alkyl group having 1 to 8 carbon atoms and specifically methyl, ethyl, propyl, n-butyl, sec-butyl, hexyl, 2-ethylhexyl and octyl groups. The cycloalkyl group includes preferably a cycloalkyl group having 3 to 8 carbon atoms and specifically cyclopropyl, cyclopentyl and cyclohexyl groups. The alkenyl group includes preferably an alkenyl group having 2 to 6 carbon atoms and specifically vinyl, propenyl, allyl, butenyl, pentenyl, hexenyl and cyclohexenyl groups. The alkyl, cycloalkyl or alkenyl group may have a substituent.

In the substituents represented by $X_1$-A, $X_2$-A and $X_3$-A in formulas (IId) to (IVd), $X_1$ to $X_3$ each represents a single bond or a divalent group. Examples of the divalent group include an alkylene group, an alkenylene group, a cycloalkylene group, —O—, —SO$_2$—, —O—CO—$R^{26}$—, —CO—O—$R^{27}$— and —CO—NR$^{28}$—$R^{29}$—. $X_1$ to $X_3$ may be the same or different.

Examples of the alkylene, alkenylene and cycloalkylene groups for $X_1$ to $X_3$ include divalent groups having the same skeletons to the alkyl, alkenyl and cycloalkyl groups represented by $R^{11}$, $R^{12}$ and $R^{14}$ to $R^{16}$, respectively.

$R^{26}$, $R^{27}$ and $R^{29}$ in the —O—CO—$R^{26}$—, —CO—O—$R^{27}$— and —CO—NR$^{28}$—$R^{29}$— of $X_1$ to $X_3$ each represents a single bond or a divalent group. Examples of the divalent group include an alkylene group, an alkenylene group and a cycloalkylene group. The alkylene, alkenylene and cycloalkylene groups for $R^{26}$, $R^{27}$ and $R^{29}$ include divalent groups having the same skeletons to the alkyl, alkenyl and cycloalkyl groups represented by $R^{11}$, $R^{12}$ and $R^{14}$ to $R^{16}$, respectively. These groups may be further bonded to an ether, ester, amid, urethane or ureido group to form a divalent group as a whole. $R^{26}$, $R^{27}$ and $R^{29}$ may be the same or different.

$R^{28}$ in the group of —CO—NR$^{28}$—$R^{29}$— for $X_1$ to $X_3$ represents a hydrogen atom, an alkyl group, a cycloalkyl group or an alkenyl group similar to $R^{23}$ to $R^{25}$. The alkyl, cycloalkyl and alkenyl groups may have a substituent. $R^{28}$ may be the same as or different from either one of $R^{24}$ or $R^{25}$.

Specific examples of the alkyl, cycloalkyl or alkenyl group represented by $R^{28}$ include those of the alkyl, cycloalkyl and alkenyl group represented by each of $R^{23}$ to $R^{25}$, respectively.

The substituent A indirectly bonded to the main chain of recurring units via $X_1$, $X_2$ or $X_3$ represents a monocyclic or polycyclic hydrocarbon group.

Examples of the monocyclic hydrocarbon group represented by A include a group having an alicyclic skeleton having at least 3 carbon atoms, preferably 3 to 8 carbon atoms. Specific examples of the cyclic hydrocarbon skeleton include, for example, cyclopropane, cyclobutane, cyclopentane and cyclohexane.

Examples of the polycyclic hydrocarbon group represented by A include a group having an alicyclic skeleton having at least 5 carbon atoms, preferably 7 to 25 carbon atoms. Specific examples of the polycyclic alicyclic skeleton include bicyclo, tricyclo and tetracyclo skeletons. The monocyclic or polycyclic hydrocarbon skeletons may have a substituent to increase the number of their carbon atoms.

Preferred examples of the substituent for the polycyclic alicyclic group include a hydroxyl group, a halogen atom, a nitro group, a cyano group, an amido group, a sulfonamido group and the alkyl group for $R^{23}$ described above.

Examples of the halogen atom include fluorine, chlorine, bromine and iodine atoms. Other examples of the substituent include an alkoxy group, an alkoxycarbonyl group, an acyl group, an acyloxy group and a carboxyl group.

Examples of the alkoxy group include an alkoxy group having 1 to 8 carbon atoms, e.g., methoxy, ethoxy, hydroxyethoxy, propoxy, hydroxypropoxy and butoxy groups.

Examples of the alkoxycarbonyl group include methoxycarbonyl and ethoxycarbonyl groups.

Examples of the acyl group include formyl, acetyl and benzoyl groups.

Examples of the acyloxy group include acetoxy and butyryloxy groups.

Specific representative structural examples of the polycyclic or monocyclic alicyclic portion in the polycyclic or monocyclic hydrocarbon group represented by A are shown below.

(1)

(2)

(3)

(4)

(5)

(6)

(7)

(8)

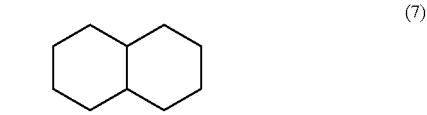

(9)

(10)

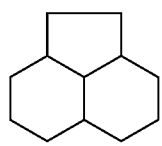
(11)
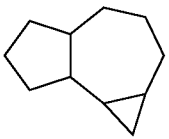
(12)
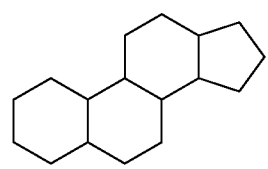
(13)
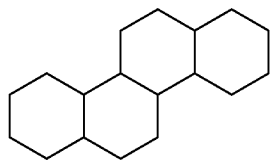
(14)
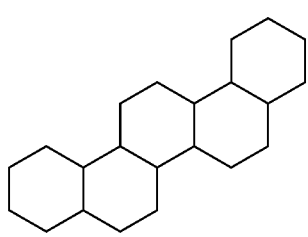
(15)
(16)
(17)
(18)
(19)
(20)
(21)
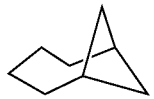
(22)
(23)
(24)
(25)
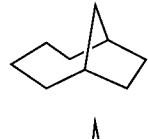
(26)
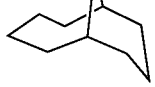
(27)
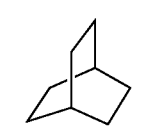
(28)
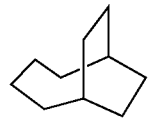
(29)
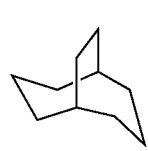
(30)
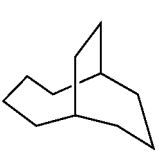
(31)
(32)
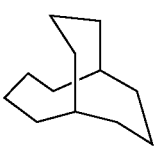
(33)

(34) 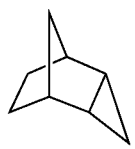

(35) 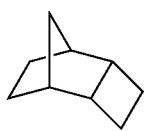

(36) 

(37) 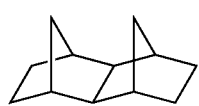

(38) 

(39) 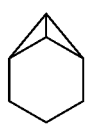

(40) 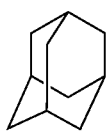

(41) 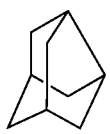

(42) 

(43) 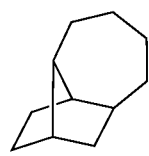

(44) 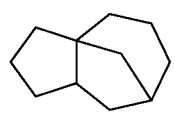

(45) 

(46) 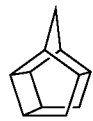

(47) 

(48) 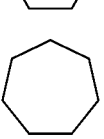

(49) 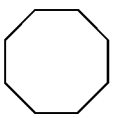

(50) 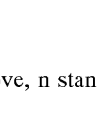

In formula (Vd) above, n stands for 0 or 1.

$X_a$ and $X_b$ each represents a hydrogen atom or an alkyl group having 1 to 4 carbon atoms.

$Y_a$ and $Y_b$ each represents a hydrogen atom, a hydroxyl group or a group of —COOX$_c$, wherein $X_c$ represents, in one mode, a hydrogen atom or an alkyl group.

The alkyl group includes an alkyl group having 1 to 8 carbon atoms, preferably 1 to 4 carbon atoms. Specific examples thereof include methyl, ethyl, propyl, butyl and tert-butyl groups. In the alkyl group, a part or all of the hydrogen atoms may be substituted with a hydroxyl group, a halogen atom or a cyano group.

In another mode, $X_c$ represents a group capable of constituting an acid decomposable group as the whole of —COOX$_c$. Specific examples of such a group include the groups represented by formulae (x) and (y). Groups containing a lactone structure having the acid decomposability and groups containing an alicyclic structure having the acid decomposability are also exemplified.

Specific examples of the recurring structural unit represented by formulas (IId) to (Vd) are described below, but the invention is not limited thereto.

(b1)

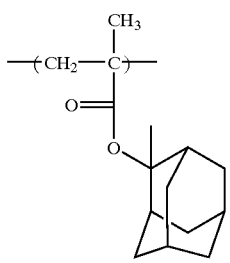

-continued
(b2) 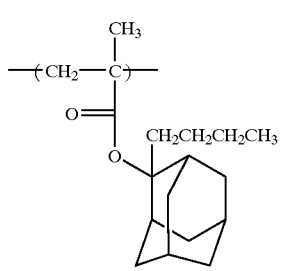
(b3) 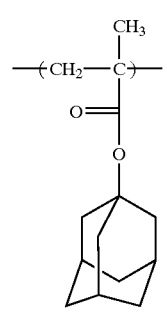
(b4) 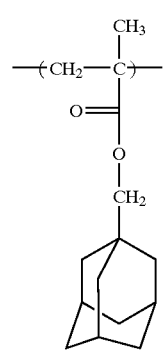
(b5) 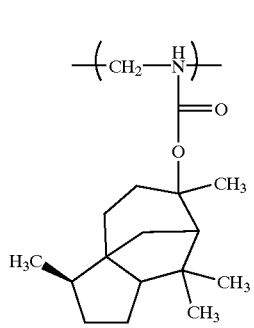
(b6) 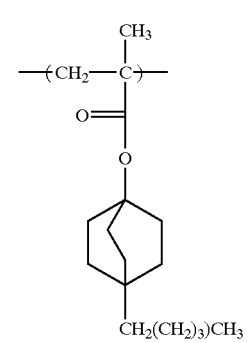
-continued
(b7) 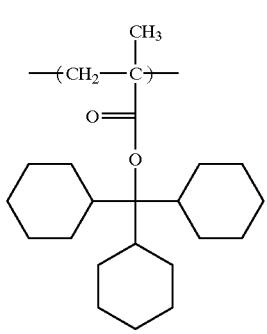
(b8) 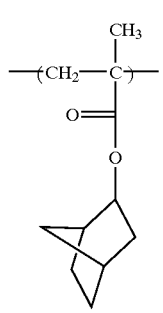
(b9) 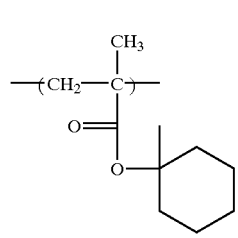
(b10) 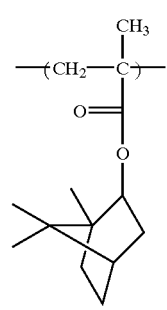
(b11) 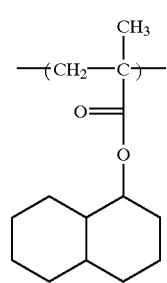

(b12) (b13) (b14) (b15) (b16) (b17) (b18) (b19) (b20) (b21) (b22) (b23)

49
-continued
(b24) 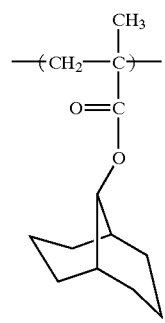
(b25) 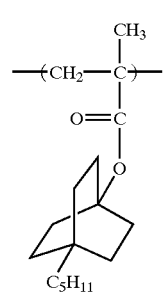
(b26) 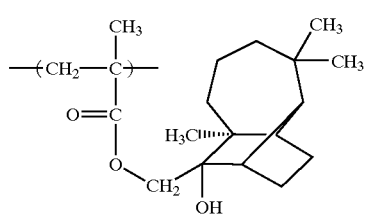
(b27) 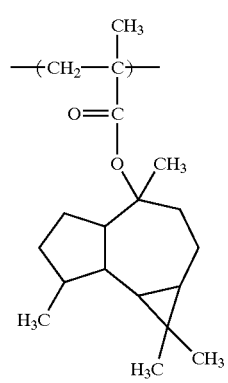
(b28) 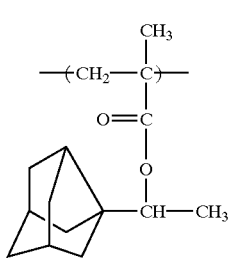
50
-continued
(b29) 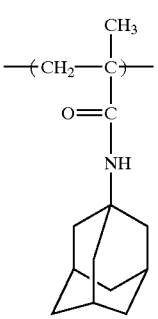
(b30) 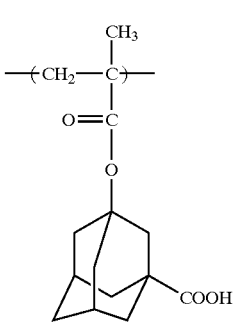
(b31) 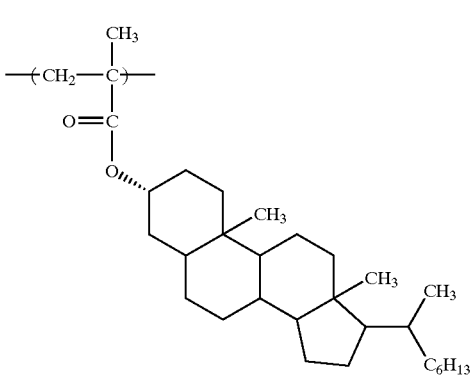
(b32) 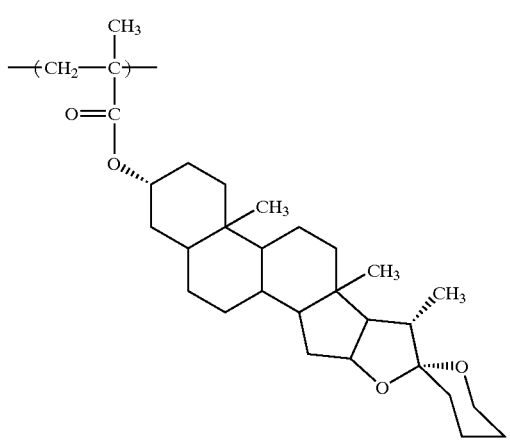

-continued
(b33)
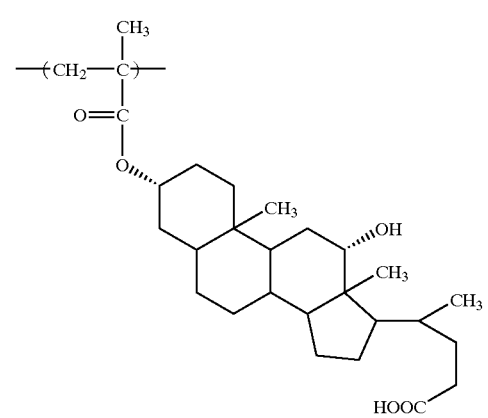
(b34)
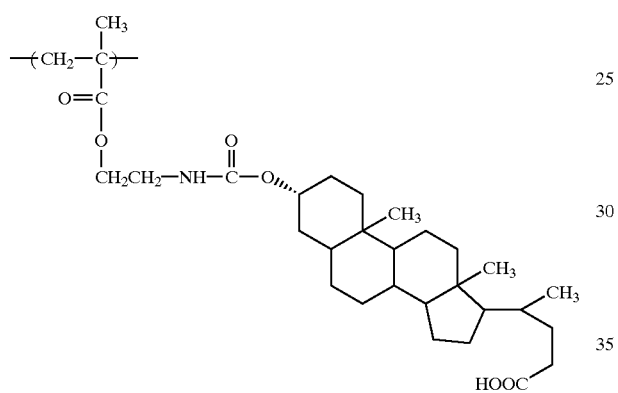
(b35)
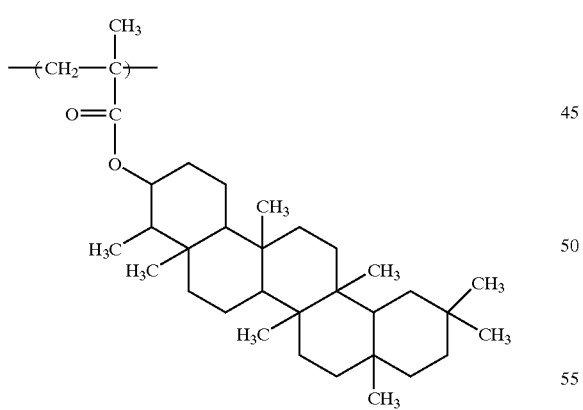
(b36)
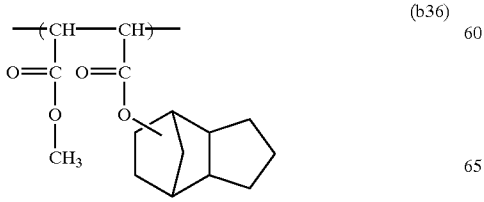
-continued
(b37)
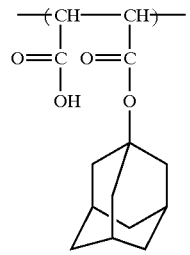
(b38)
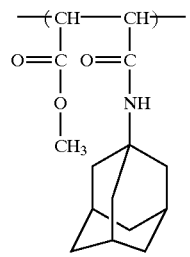
(b39)
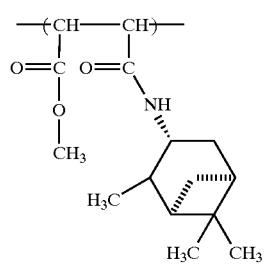
(b40)
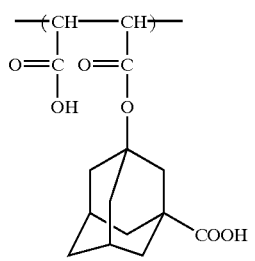
(b41)
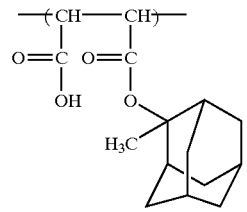
(b42)
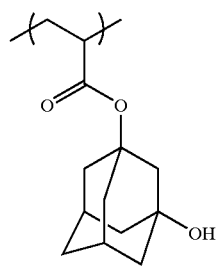

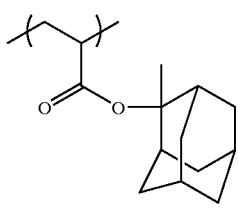 (b43)
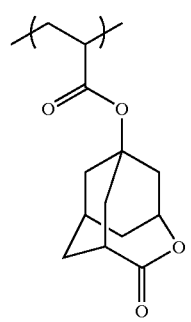 (b44)
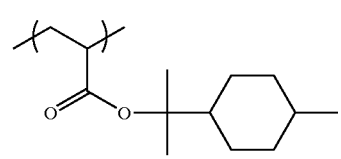 (b45)
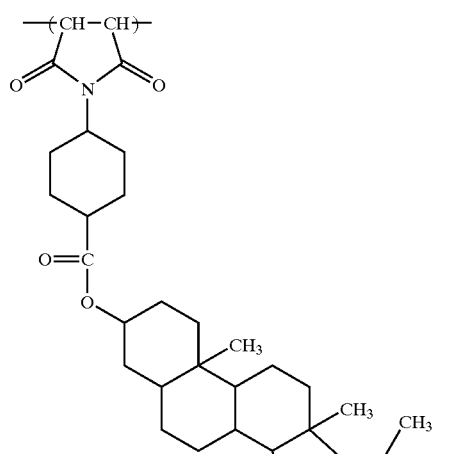 (b46)
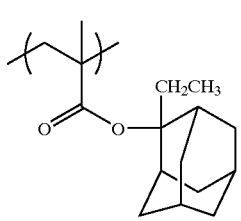 (b-47)
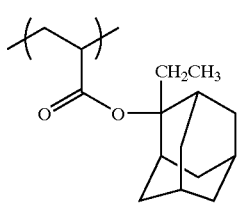 (b-48)
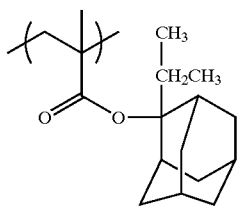 (b-49)
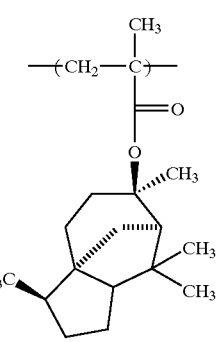 (b-50)
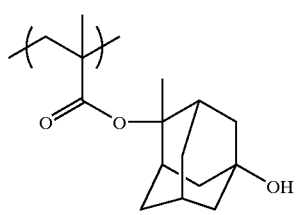 (b51)
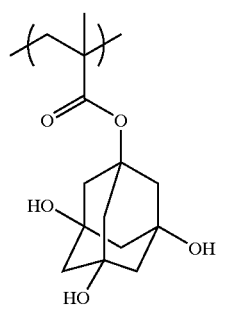 (b52)
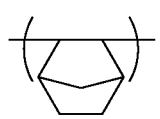 (b53)
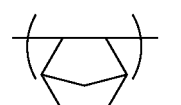 (b54)
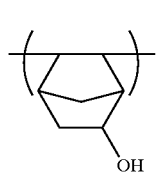 (b55)

(b56) 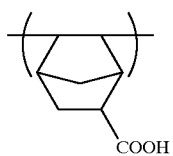

(b57) 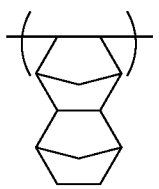

(b58) 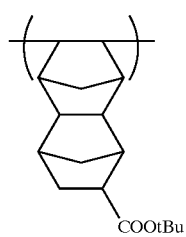

(b59) 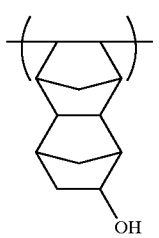

(b60) 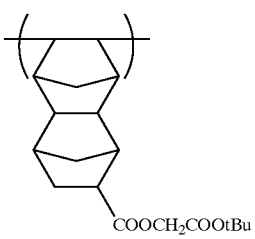

(b61) 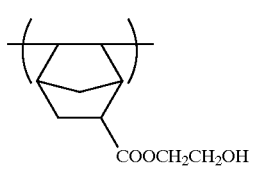

(b62) 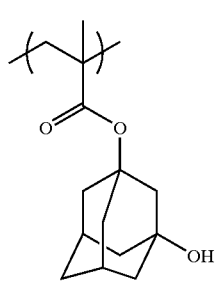

(b63) 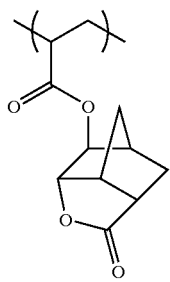

(b64) 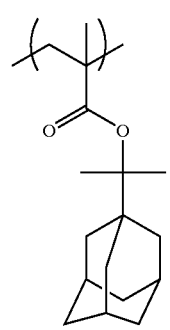

Of the specific examples, (b1), (b2), (b5), (b9), (b47), (b48), (b49), (b50), (b54), (b58) and (b60) are preferred, because they have ordinarily the acid decomposability. Above all, (b1), (b47), (b48) and (b49) wherein an adamantyl group is bonded to the main chain of the resin via an acid decomposable structure are preferred. By the use of the recurring unit, dry etching resistance and resolution are improved.

Into the acid decomposable resin, a carboxyl group may further be incorporated.

The carboxyl group may be incorporated in the recurring structural unit described above or another recurring structural unit.

The carboxyl groups may be incorporated at plural positions of the recurring structural unit.

The content of the whole recurring structural units having the carboxyl group in the acid decomposable resin contained in the positive photosensitive composition of the invention can be adjusted depending on the performances of the composition, for example, alkali developability, adhesion to a substrate or sensitivity. It is preferably 0 to 60% by mole, more preferably 0 to 40% by mole, and still more preferably 0 to 20% by mole, based on the whole recurring structural units of the acid decomposable resin.

Specific examples of the recurring structural unit containing a carboxyl group are described below, but the invention is not limited thereto.

(d1) 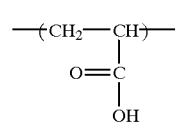

-continued

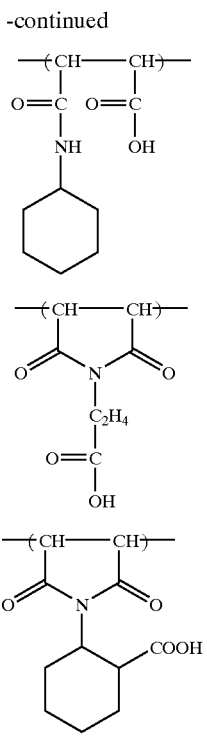

For the purpose of improving the performance of the acid decomposable resin, another polymerizable monomer may be copolymerized insofar as its transmittance at 220 nm or less and dry etching resistance are not significantly impaired by the copolymerization.

Examples of the comonomer used include compounds having one addition-polymerizable unsaturated bond, for example, acrylic esters, acrylamides, methacrylic esters, methacrylamides, allyl compounds, vinyl ethers, vinyl esters, styrenes and crotonic esters.

Specific examples of the acrylic ester include an alkyl acrylate wherein the alkyl group preferably has 1 to 10 carbon atoms (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethyl-3-hydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate), an aryl acrylate and methoxyethoxyethyl acrylate.

Specific examples of the methacrylic ester include an alkyl methacrylate wherein the alkyl group preferably has 1 to 10 carbon atoms (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate), an aryl methacrylate (e.g., phenyl methacrylate or naphthyl methacrylate) and methoxyethoxyethyl methacrylate.

Specific examples of the acrylamide includes acrylamide, an N-alkylacrylamide wherein the alkyl group has 1 to 10 carbon atoms, e.g., methyl, ethyl, propyl, butyl, tert-butyl, heptyl, octyl, cyclohexyl, benzyl or hydroxyethyl, an N-arylacrylamide, an N,N-dialkylacrylamide wherein the alkyl group has 1 to 10 carbon atoms, e.g., methyl, ethyl, butyl, isobutyl, ethylhexyl or cyclohexyl, an N,N-arylacrylamide, N-hydroxyethyl-N-methylacrylamide and N-2-acetamidoethyl-N-acetylacrylamide.

Specific examples of the methacrylamide includes methacrylamide, an N-alkylmethacrylamide wherein the alkyl group has 1 to 10 carbon atoms, e.g., methyl, ethyl, tert-butyl, ethylhexyl, hydroxyethyl or cyclohexyl, an N-arylmethacrylamide, an N,N-dialkylmethacrylamide having an alkyl group, e.g., ethyl, propyl or butyl, N-hydroxyethyl-N-methylmethacrylamide, N-methyl-N-phenylmethacrylamide and N-ethyl-N-phenylmethacrylamide.

Specific examples of the allyl compound include an allyl ester (e.g., allyl acetate, allyl caproate, allyl caprylate, allyl laurate, allyl palmitate, allyl stearate, allyl benzoate, allyl acetoacetate or allyl lactate) and allyloxyethanol.

Specific examples of the crotonic ester include an alkyl crotonate (e.g., butyl crotonate, hexyl crotonate or glycerol monocrotonate).

Other examples of the comonomer include a dialkyl itaconate (e.g., dimethyl itaconate, diethyl itaconate or dibutyl itaconate), a dialkyl maleate (e.g., dimethyl maleate), a dialkyl fumarate (e.g., dibutyl fumarate), maleic anhydride, maleimide, acrylonitrile, methacrylonitrile and maleonitrile.

In addition, other addition polymerizable unsaturated compounds ordinarily copolymerizable may be used.

Of the comonomers, methoxyethoxyethyl methacrylate and methoxyethoxyethyl acrylate are particularly preferred.

The content of recurring structural units derived from the other polymerizable monomers in the acid decomposable resin (B) is preferably 50% by mole or less, and more preferably 30% by mole or less, based on the whole recurring structural units.

The acid decomposable resin in the invention preferably contains a structural unit represented by formula (I) or (II) described above.

In formula (I) or (II), R1 to $R_4$ each independently represents a hydrogen atom, a carboxyl group, a hydroxy group, a substituted or unsubstituted alkyl group, a substituted or unsubstituted alkoxycarbonyl group or a group having the acid decomposable group, and n stands for 0 or 1.

The alkyl moiety in the alkyl group or the alkoxycarbonyl group is preferably an alkyl group having 1 to 7 carbon atoms and specific examples thereof include methyl, ethyl, propyl, n-butyl, sec-butyl, tert-butyl, n-pentyl, n-hexyl and n-heptyl groups.

Examples of the substituent for the alkyl or alkoxycarbonyl group include a hydroxyl group and alkoxycarbonyl group.

Specific examples of the structural unit represented by the formula (I) include the above-described structural units (b53) to (b61).

The acid decomposable resin of the invention preferably contains a (meth)acrylate structural unit represented by formula (III) shown below.

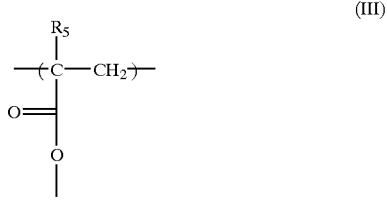

(III)

In formula (III), $R_5$ represents a hydrogen atom or a methyl group.

It is preferred that the (meth)acrylate structural unit further contains an alicyclic hydrocarbon structure, a lactone structure or a carboxyl group.

Specific examples of the (meth)acrylate structural unit having an alicyclic hydrocarbon structure include the above-described structural units (b1) to (b-19), (b21) to (b28), (b30) to (b37), (b40) to (b45), (b47) to (b52) and (b62) to (b64).

Specific examples of the (meth)acrylate structural unit having a lactone structure include the above-described structural units (a1) to (a20), (b44) and (b63).

Specific examples of the (meth)acrylate structural unit having a carboxyl group include the above-described structural units (d1) to (d6) and (d10) to (d16).

Of the acid decomposable resins in the invention, those containing the structural unit (b44) or (b63) wherein both the alicyclic hydrocarbon structure and the lactone structure are present are preferred, because they improve dry etching resistance.

Of the acid decomposable resins in the invention, those having the structural unit represented by formula (I) or (II) and a structural unit of maleic anhydride or maleic anhydride derivative shown below are preferred.

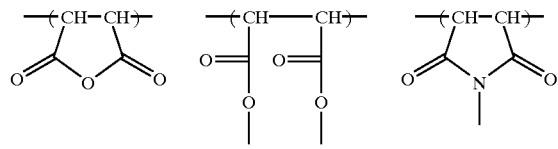

Specific examples of the maleic anhydride derivative structural unit include the above-described structural units (d17) and (d18).

Of the acid decomposable resin in the invention, those having the structural unit represented by formula (I) or (II), the structural unit of maleic anhydride or maleic anhydride derivative and a (meth)acrylate structural unit are also preferred.

Of the acid decomposable resin in the invention, a mixture of a resin having the structural unit represented by formula (I) or (II) and the structural unit of maleic anhydride or maleic anhydride derivative and a resin containing a (meth) acrylate structural unit is also preferred.

From the viewpoint of dry etching resistance, it is preferred that the acid decomposable resin of the invention contains the monocyclic or polycyclic alicyclic hydrocarbon structure in all the recurring units.

From the viewpoint of the balance between hydrophilicity and dry etching resistance, it is particularly preferred that the acid decomposable resin of the invention contains a recurring unit having an adamantyl group, a recurring unit having a hydroxyadamantyl group and the recurring unit having a lactone structure.

In order to sustain transparency to actinic rays or radiation, the acid decomposable resin (B) is preferred to be free of an aromatic ring. When transparency to radiation lowers by the introduction of an aromatic group to the resin, the exposed light does not easily reach the bottom of the resist film, inevitably resulting in the formation of a pattern profile called taper.

Although the content of the recurring structural unit having an acid decomposable group in the acid decomposable resin (B) is adjusted taking, for example, the balance between dry etching resistance and alkali developability into consideration, it is preferably 10% by mole or greater, more preferably 15% by mole or greater, and still more preferably 20% by mole or greater, based on the whole recurring unit.

Although the content of the cyclic hydrocarbon-containing structural unit (preferably, the recurring structural unit represented by formulas (II) to (IV)) in the acid decomposable resin (B) is adjusted taking, for example, the balance between dry etching resistance and alkali developability into consideration, it is preferably 20% by mole or greater, more preferably 30 to 80% by mole, still more preferably 35 to 70% by mole, and still more preferably 40 to 60% by mole, based on the whole recurring unit.

Although the content of the recurring unit having a lactone structure in the acid decomposable resin (B) is adjusted taking, for example, the balance between dry etching resistance and alkali developability into consideration, it is preferably 5% by mole or greater, more preferably 10% by mole or greater, and still more preferably 20% by mole or greater, based on the whole recurring structural unit.

In the invention, the amount of the resin (B) being decomposed by the action of an acid to increase solubility in an alkali developer is 20 to 99.8% by weight, and preferably 50 to 99.5% by weight, based on the whole composition excepting a solvent or based on the solid content.

The weight average molecular weight of the acid decomposable resin (B), measured by a GPC method and indicated in terms of polystyrene, preferably falls within a range of 1,000 to 100,000, more preferably 2,000 to 50,000, and still more preferably 3,000 to 30,000. The distribution degree is preferably 1.0 to 5.0, and more preferably 1.0 to 3.0.

<(C) Basic Compound>

The positive photosensitive composition of the invention preferably contains a basic compound (C) for suppressing changes in performances occurred with the passage of time from exposure to heating.

The basic compound preferably has a structure represented by formulas (A) to (E) shown below.

(A)

In the formula, $R^{250}$, $R^{251}$ and $R^{252}$ each independently represents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms, or $R^{250}$ and $R^{251}$ may be bonded to each other to form a ring.

(B)

-continued

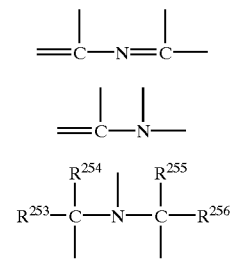

(C)

(D)

(E)

In the formula, $R^{253}$, $R^{254}$, $R^{255}$ and $R^{256}$ each independently represents an alkyl group having 1 to 6 carbon atoms. Preferred specific examples of the basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, mono-, di- or trialkylamines, substituted or unsubstituted anilines, substituted or unsubstituted piperidines and mono- or diethanolamine. Preferred examples of the substituents for these compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Basic compounds having at least 2 nitrogen atoms which exist under different environments, for example, imidazole derivatives, diazabicycloundecene, diazabicyclononene or aminopyridine derivatives are also preferred. Hydroxyl-containing alkylamines, e.g., triethanolamine, tetraalkylammonium hydroxides having an alkyl group having 1 to 8 carbon atoms, e.g., tetrabutylammonium hydroxide, and onium carboxylates, e.g., sulfonium, iodonium or ammonium carboxylate are also preferred.

Especially preferred examples of the basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0] undec-7-ene, 2,4,5-triphenylimidazole, tri(n-butyl)amine, tri (n-octyl)amine, N-phenyldiethanolamine, N-hydroxyethylpiperidine, 2,6-diisopropylaniline and N-cyclohexyl-N'-morpholinoethylthiourea. However, the basic compounds used in the present invention are not limited thereto.

More preferred compounds include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines and substituted or unsubstituted piperidines. Compounds having an imidazole structure, a diazabicyclo structure, an onium hydroxide structure, an onium carboxylate structure or a trialkylamine structure and aniline compounds are also preferred. Particularly, compounds having an imidazole structure, a diazabicyclo structure, an onium hydroxide structure or an onium carboxylate structure are preferred.

The compound having an imidazole structure includes imidazole, 2,4,5-triphenylimidazole and benzimidazole. The compound having a diazabicyclo structure includes 1,4-diazabicyclo[2.2.2]octane, 1,5-diazabicyclo[4.3.0]non-5-ene and 1,8-diazabicyclo[5.4.0]undec-7-ene. The compound having an onium hydroxide structure includes a triarylsulfonium hydroxide, phenacyl sulfonium hydroxide and a 2-oxoalkyl-containing sulfonium hydroxide, e.g., triphenylsulfonium hydroxide, tris(t-butylphenyl)sulfonium hydroxide, bis(tert-butylphenyl)iodonium hydroxide, phenacyl thiophenium hydroxide and 2-oxopropylthiophenium hydroxide. The compound having an onium carboxylate structure includes a compound wherein an anion portion of the compound having an onium hydroxide structure is replaced by a carboxylate, e.g., acetate, adamantane-1-carboxylate and a perfluoroalkyl carboxylate. The compound having a trialkylamine structure includes an unsubstituted alkylamine, e.g., triethylamine, tributylamine and trioctylamine, and an alkylamine substituted with a hydroxyl group, e.g., triethanolamine and N-hydroxyethylpiperidine. The aniline compound includes 2,6-diisopropylaniline and N,N-dimethylaniline. The present invention is however not limited to these examples. In the onium hydroxide structure and onium carboxylate structure, the onium is preferably selected from sulfonium, iodonium and ammonium.

The basic compounds (C) may be used singly or as a mixture of two or more thereof. The amount of the basic compound (C) is usually 0.001 to 10% by weight, preferably 0.01 to 5% by weight, based on the solid content of the photosensitive composition. At an amount less than 0.001% by weight, the basic compound does not bring about sufficient effects. At an amount exceeding 10% by weight, on the other hand, the sensitivity tends to decrease or the developability tends to degrade at the unexposed area.

<(D) Fluorine and/or Silicon Surfactant>

The positive photosensitive composition of the invention preferably contains one or two or more of fluorine and/or silicon surfactants (a fluorine surfactant, a silicon surfactant and a surfactant containing both a fluorine atom and a silicon atom).

By the addition of the surfactant (D), the positive photosensitive composition of the invention can provide, at high sensitivity and resolution, resist patterns having good adhesion and less defect in development, when an exposure light source of 250 nm or less, especially 220 nm or less is used.

Specific examples of the surfactant (D) include those as described in Japanese Patent Laid-Open Nos. 36663/1987, 226746/1986, 226745/1986, 170950/1987, 34540/1988, 230165/1995, 62834/1996, 54432/1997 and 5988/1997 and U.S. Pat. Nos. 5,405,720, 5,360,692, 5,529,881, 5,296,330, 5,436,098, 5,576,143, 5,294,511 and 5,824,451. Commercially available surfactants described below may also be used as they are.

Examples of the commercially available surfactant used include fluorine or silicon surfactants, e.g., Eftop EF301 and EF303 (produced by Shin-Akita Kasei Co., Ltd.), Florad FC430 and EC431 (produced by Sumitomo 3M Ltd.), Megafac F171, F173, F176, F189 and R08 (produced by Dainippon Ink and Chemicals, Inc.), Surflon S-382, SC101, 102, 103, 104, 105 and 106 (produced by Asahi Glass Co., Ltd.) and Troysol S-366 (produced by Troy Chemical Corp.). A polysiloxane polymer KP-341 (produced by Shin-Etsu Chemical Co., Ltd.) is also used as a silicon surfactant.

The surfactant is preferably used in an amount of 0.0001 to 2% by weight, more preferably 0.001 to 1% by weight, based on the whole amount of the positive photosensitive composition (excluding a solvent).

<(E) Organic Solvent>

The photosensitive composition of the invention is used by dissolving the above-described components in a predetermined organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the invention, it is preferred to use, as an organic solvent, a mixture of a solvent containing a hydroxyl group and a solvent free of a hydroxyl group. This makes it possible to suppress the generation of particles during storage of the resist solution.

Examples of the hydroxyl-containing solvent include ethylene glycol, ethylene glycol monomethyl ether, ethylene glycol monoethyl ether, propylene glycol, propylene glycol monomethyl ether, propylene glycol monoethyl ether and ethyl lactate. Ethylene glycol monoalkyl ethers and propylene glycol monoalkyl ethers are preferred. Propylene glycol monomethyl ether and ethyl lactate are more preferred.

Examples of the hydroxyl-free solvent include propylene glycol monomethyl ether acetate, ethyl ethoxypropionate, 2-heptanone, y-butyrolactone, cyclohexanone, butyl acetate, N-methylpyrrolidone, N,N-dimethylacetamide and dimethylsulfoxide. A solvent containing a ketone or ester group (linear or cyclic), for example, propylene glycol monomethyl ether acetate, ethyl ethoxypropionate, 2-heptanone, y-butyrolactone, cyclohexanone or butyl acetate is preferred.

A mixture of propylene glycol monomethyl ether and propylene glycol monomethyl ether acetate is a preferred example of the organic solvent used in the invention.

A mixing ratio (by weight) of the hydroxyl-containing solvent to hydroxyl-free solvent ranges from 1/99 to 99/1, preferably from 10/90 to 90/10, more preferably from 20/80 to 50/50. A mixed solvent containing 50% by weight or more of the hydroxyl-free solvent is also especially preferred in view of uniform coating.

<(F) Acid Decomposable Dissolution Inhibiting Compound>

The positive photosensitive composition of the invention is preferred to contain a dissolution inhibiting low molecular weight compound (F) (hereinafter also referred to as an "acid decomposable dissolution inhibiting compound (F)") having a group capable of being decomposed by the action of an acid to increase solubility in an alkali developer and having a molecular weight of 3,000 or less.

In order to prevent deterioration in transmittance at 220 nm or less, an alicyclic or aliphatic compound having an acid decomposable group, for example, a cholic acid derivative having an acid decomposable group as described in *Proceeding of SPIE*, 2724, 355(1966) is preferred as the acid decomposable dissolution inhibiting compound (F). Examples of the acid decomposable group and alicyclic structure are similar to those described above regarding the acid decomposable resin.

The amount of the acid decomposable dissolution inhibiting compound (F) is preferably 3 to 50% by weight, more preferably 5 to 40% by weight, based on the solid content of the whole positive photosensitive composition.

Specific examples of the acid decomposable dissolution inhibiting compound (F) are shown below, but the invention is not limited thereto.

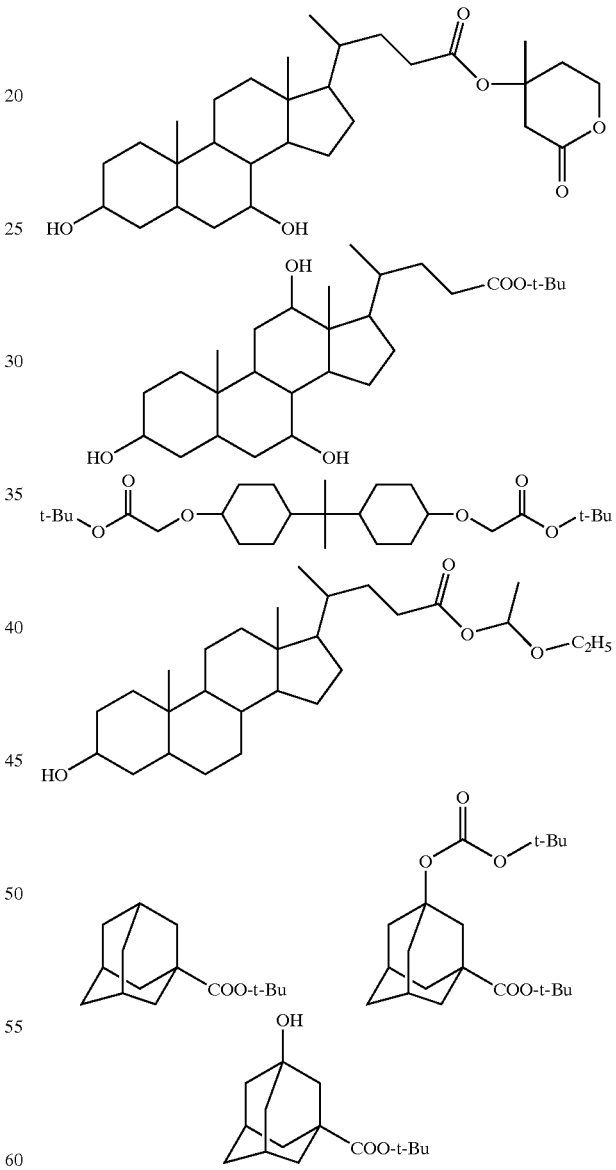

<(G) Alkali Soluble Resin>

The positive photosensitive composition of the invention may contain a resin (G) free of an acid decomposable group, insoluble in water and soluble in an alkali developer. By the addition of the resin, the sensitivity of the composition can be improved.

In the invention, novolac resins having a molecular weight of about 1,000 to 20,000 and polyhydroxystyrene derivatives having a molecular weight of about 3,000 to 50,000 are used as the resin. They exhibit large absorption of light of 250 nm or less so that they are preferably used after partial hydrogenation or preferably used in an amount not greater than 30% by weight based on the whole resin.

Resins having a carboxyl group as an alkali solubilizing group are also used. The carboxyl-containing resins preferably have a monocyclic- or polycyclic alicyclic hydrocarbon group for improvement of dry etching resistance. Specific examples thereof include a methacrylic ester/(meth)acrylic acid copolymer having an alicyclic hydrocarbon structure which does not exhibit acid decomposability and a (meth) acrylic ester resin containing an alicylic hydrocarbon group having a carboxyl group at the terminal thereof.

<Other Additives>

In the positive photosensitive composition of the invention, a dye, a plasticizer, a surfactant other than the component (D), a photosensitizer and a compound for promoting solubility in a developer may be used.

The dissolution promoting compound in a developer used in the invention is a compound having a molecular weight as low as 1,000 or less and having at least two phenolic hydroxyl groups or at least one carboxyl group. When the compound has a carboxyl group, an alicyclic or aliphatic compound is preferred because of the same reason as above.

The dissolution promoting compound is preferably used in an amount of 2 to 50% by weight, more preferably 5 to 30% by weight, based on the resin (B) capable of being decomposed by the action of an acid to increase solubility in an alkali developer. The amount exceeding 50% by weight is not preferred, because another drawback of increase in development residue and deformation of patterns upon development may occur.

Such phenolic compounds having a molecular weight of 1,000 or less can be synthesized readily by one skilled in the art with reference to the process as described, for example, in Japanese Patent Laid-Open Nos. 122938/1992 and 28531/1990, U.S. Pat. No. 4,916,210 and European Patent 219,294.

Specific examples of the carboxyl-containing alicyclic or aliphatic compound include carboxylic acid derivatives having a steroid structure, e.g., cholic acid, deoxycholic acid or lithocholic acid, adamantanecarboxylic acid derivatives, adamantanedicarboxylic acid, cyclohexanecarboxylic acid and cyclohexanedicarboxylic acid, but the invention is not limited thereto.

In the invention, a surfactant other than the fluorine and/or silicon surfactants (D) may be added. Specific examples thereof include nonionic surfactants, for example, polyoxyethylene alkyl ethers, e.g., polyoxyethylene lauryl ether, polyoxyethylene stearyl ether, polyoxyethylene cetyl ether and polyoxyethylene oleyl ether; polyoxyethylene alkyl aryl ethers, e.g., polyoxyethylene octyl phenol ether and polyoxyethylene nonyl phenol ether; polyoxyethylene/polyoxypropylene block copolymers; sorbitan fatty acid esters, e.g., sorbitan monolaurate, sorbitan monopalmitate, sorbitan monostearate, sorbitan monooleate, sorbitan trioleate and sorbitan tristearate; and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The surfactants may be used singly or in combination.

<Method for Use>

The photosensitive composition of the invention is applied onto a desired substrate after dissolving the components in a predetermined solvent, preferably in the mixed solvent, as described above.

Specifically, the photosensitive composition is applied to a substrate (e.g., silicon/silicon dioxide coating) as used for the production of a precise integrated circuit device by appropriate application means, for example, spinner or coater.

After the application, the resulting photosensitive layer is exposed to light through a predetermined mask, followed by baking and development. Thus, good resist patterns are obtained. As the light for exposure, a far ultraviolet ray having preferably a wavelength of 250 nm or shorter, more preferably 220 nm or shorter is used. Specific examples thereof include KrF excimer laser light (248 nm), ArF excimer laser (193 nm), $F_2$ excimer laser light (157 nm), X-rays and electron beams.

In the development step, a developer as described below is used. The developer for the photosensitive composition includes an alkaline aqueous solution containing, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcohol amine, e.g., dimethylethanolamine or triethanolamine; a quaternary ammonium salt, e.g., tetramethylammonium hydroxide or tetraethylammonium hydroxide; and a cyclic amine, e.g., pyrrole or piperidine.

A developer prepared by adding an appropriate amount of an alcohol or surfactant to the alkaline aqueous solution is also used.

The present invention is described in more detail with reference to the following examples, but the invention is not limited thereto.

<Synthesis Example of Resin>

Synthesis of Resin (P1)((a1)/(b1)=50/50)

A solution obtained by dissolving 5.0 g of 2-methyl-2-adamanthyl methacrylate, 4.23 g of mevalonic lactone methacrylate and as a polymerization initiator, 0.534 g of 2,2'-azobis(2,4-dimethylvaleronitrile) (V-65, produced by Wako Pure Chemical Industries, Ltd.) in 30.0 g of N,N-dimethylacetamide was added dropwise over 4 hours to 7.0 g of N,N-dimethylacetamide heated to 60° C. under a nitrogen gas stream. After the reaction for further 2 hours at 60° C., 0.267 g of V-65 was added to the reaction mixture. The resulting mixture was further reacted for 2 hours. The reaction mixture was poured into 1,000 ml of deionized water. Powders thus precipitated were collected by filtration. The powders were dissolved in THF and the solution was poured into 1,500 ml of hexane. The powders thus obtained were dried to obtain Resin (P1).

It was found that the resulting resin had a weight average molecular weight of 5,500 and distribution (Mw/Mn) of 1.9. The weight average molecular weight and distribution were determined by DSC and indicated in terms of polystyrene.

Synthesis of Resins (P2) to (P19)

In a substantially similar manner, Resins (P2) to (P19) shown in Table 1 below were synthesized. The molecular weight and distribution of each of these resins are also shown in Table 1.

TABLE 1

| Resin | Monomers (Ratio) | Molecular Weight (Distribution) |
|---|---|---|
| (P1) | a1/b1 (50/50) | 5,500 (1.9) |
| (P2) | a1/b1/methacrylic acid (45/45/10) | 9,000 (1.9) |
| (P3) | a4/b47 (55/45) | 16,700 (1.8) |
| (P4) | a4/b5 (60/40) | 4,600 (2.2) |
| (P5) | a5/b47/methacrylic acid (45/45/10) | 8,700 (2.1) |
| (P6) | a5/b1 (50/50) | 5,600 (1.7) |
| (P7) | a18/b1 (50/50) | 2,3000 (2.3) |
| (P8) | a16/b1 (50/50) | 12,300 (2.2) |
| (P9) | a16/b1/methacrylic acid (45/45/10) | 14,100 (1.9) |
| (P10) | b54/maleic anhydride (50/50) | 3,600 (2.0) |
| (P11) | b54/b55/b56/maleic anhydride (15/25/10/50) | 5,400 (1.9) |
| (P12) | a1/b1/diethylene glycol monomethyl ether methacrylate (47.5/47.5/5) | 10,100 (2.4) |
| (P13) | b53/maleic anhydride/tert-butyl acrylate (40/40/20) | 11,000 (1.8) |
| (P14) | b53/maleic anhydride/tert-butyl butyl acrylate/a20 (36/36/18/10) | 13,000 (1.9) |
| (P15) | b1/b62/a5 (40/30/30) | 11,000 (1.8) |

TABLE 1-continued

| Resin | Monomers (Ratio) | Molecular Weight (Distribution) |
|---|---|---|
| (P16) | b53/maleic anhydride/b43/b42 (30/30/30/10) | 11,000 (1.9) |
| (P17) | b54/maleic anhydride/b48/b44 (30/30/10/20) | 13,000 (2.1) |
| (P18) | b53/maleic anhydride/b45 (35/35/30) | 8,500 (1.7) |
| (P19) | b63/b64/b52 (25/50/25) | 10,500 (1.8) |

<Preparation of Resist>

EXAMPLES 1 TO 24 AND COMPARATIVE EXAMPLES 1 AND 2

In each of Examples 1 to 24 and Comparative Examples 1 and 2, materials as shown in Table 2 below were dissolved to prepare a solution having a solid concentration of 15% by weight. The resulting solution was filtered through a 0.1 µm Teflon filter, whereby a photosensitive composition was prepared. The composition was evaluated by the methods described below and the results obtained are shown in Table 3 below.

TABLE 2

| | Resin (g) | Acid Generator (g) | Basic Compound (g) | Surfactant (0.02 g) | Other Additive (g) | Solvent (weight ratio) |
|---|---|---|---|---|---|---|
| Ex. 1 | P1 (4) P10 (6) | I-4 (0.2) | DBN (0.02) | W-1 | — | PGMEA/PGME (8/2) |
| Ex. 2 | P2 (10) | I-7 (0.3) | TPI (0.02) | W-1 | — | PGMEA/PGME (95/5) |
| Ex. 3 | P3 (10) | I-17 (0.2) | DIA (0.01) | W-1 | — | PGMEA/PGME (5/5) |
| Ex. 4 | P4 (4.5) P13 (4.5) | I-13 (0.3) | TPI (0.02) | W-1 | tert-Bu cholate (1) | GBL/PGME (8/2) |
| Ex. 5 | P5 (10) | I-21 (0.5) | TPI (0.02) | W-2 | — | HP/EL (9/1) |
| Ex. 6 | P6 (10) | I-20 (1) | DBN (0.02) | W-2 | — | PGMEA/PGME (8/2) |
| Ex. 7 | P7 (10) | I-17 (0.1) e1 (0.1) | TEA (0.01) | W-2 | — | PGMEA/PGME (8/2) |
| Ex. 8 | P8 (10) | I-2 (0.2) e23 (0.6) | TBAH (0.01) | W-2 | — | PGMEA/PGME (8/2) |
| Ex. 9 | P9 (10) | III-3 (0.1) I-4 (0.2) | DBN (0.02) | W-2 | — | PGMEA/PGME (8/2) |
| Ex. 10 | P10 (10) | V-2 (0.4) | TPI (0.02) | W-3 | — | PGMEA/PGME (8/2) |
| Ex. 11 | P11 (10) | VI-2 (0.3) | TPI (0.02) | W-3 | — | PGMEA/PGME (8/2) |
| Ex. 12 | P12 (10) | I-14 (0.1) II-1 (0.1) | DBN (0.02) | W-3 | — | PGMEA/PGME (8/2) |
| Ex. 13 | P13 (10) | I-17 (0.2) e18 (0.05) | TEA (0.01) | W-3 | — | PGMEA/PGME (8/2) |

TABLE 2-continued

|  | Resin (g) | Acid Generator (g) | Basic Compound (g) | Surfactant (0.02 g) | Other Additive (g) | Solvent (weight ratio) |
|---|---|---|---|---|---|---|
| Ex. 14 | P14 (10) | I-10 (0.2) | TPI (0.02) | W-3 | — | GBL/PGME (8/2) |
| Ex. 15 | P15 (10) | I-11 (0.15) | TBAH (0.01) | W-4 | — | HP/EL (9/1) |
| Ex. 16 | P16 (10) | I-4 (0.2) e29 (0.2) | DBN (0.02) | W-4 | — | PGMEA/PGME (8/2) |
| Ex. 17 | P17 (10) | I-4 (0.1) I-21 (0.2) e18 (0.1) | TPI (0.02) | W-4 | — | PGMEA/PGME (8/2) |
| Ex. 18 | P17 (10) | I-21 (0.3) e13 (0.1) | DBN (0.02) | W-4 | — | PGMEA/PGME (8/2) |
| Ex. 19 | P18 (10) | I-21 (0.4) e1 (0.2) | TEA (0.01) | W-4 | — | EL/EEP (8/2) |
| Ex. 20 | P19 (10) | I-4 (0.1) I-3 (0.1) | TPI (0.02) | W-4 | — | PGMEA/PGME (8/2) |
| Ex. 21 | P15 (5) P16 (5) | I-4 (0.1) I-20 (0.8) | TPI (0.02) | W-4 | — | EL/EEP (8/2) |
| Ex. 22 | P15 (10) | I-1 (0.2) | DBN (0.02) | W-4 | — | PGMEA/PGME (8/2) |
| Ex. 23 | P16 (10) | I-4 (0.2) e19 (0.4) | TBAH (0.03) | W-4 | — | PGMEA/PGME (8/2) |
| Ex. 24 | P15 (5) P16 (5) | I-17 (0.15) I-20 (0.2) e11 (0.05) | DBN (0.01) TPI (0.01) | W-4 | — | PGMEA/PGME (8/2) |
| Comp. Ex. 1 | P1 (4) P10 (6) | PAG-A (0.2) | DBN (0.02) | W-1 | — | PGMEA/PGME (8/2) |
| Comp. Ex. 2 | P2 (10) | I-7 (0.3) | TPI (0.02) | — | — | PGMEA/PGME (95/5) |

(Explanation of Table 2)
DBN: 1,5-diazabicyclo[4.3.0]-5-nonene
DIA: 2,6-diisopropylaniline
TPI: 2,4,5-triphenylimidazole
TEA: triethanolamine
TBAH: tetrabutylammonium hydroxide
W-1: Megafac F176 (produced by Dainippon Ink & Chemicals, Inc.) (fluorine type)
W-2: Megafac R08 (produced by Dainippon Ink & Chemicals, Inc.) (fluorine and silicon type)
W-3: polysiloxane polymer KP-341 (produced by Shin-Etsu Chemical Co., Ltd.) (silicon type)
W-4: Troysol S-366 (produced by Troy Chemical Corp.) (fluorine type)
PGMEA: propylene glycol monomethyl ether acetate
PGME: propylene glycol monomethyl ether
EL: ethyl lactate
EEP: ethyl ethoxypropionate
GBL: γ-butyrolactone
HP: 2-heptanone
PAG-A: tris(tert-butylphenyl)sulfonium perfluoro-octane sulfonate <Image Evaluation Method>
(1) Evaluation of DOF (Defocus Latitude)

An antireflective coating DUV-42 (produced by Brewer Science, Inc.) was applied uniformly with a thickness of 600 Å to a silicon substrate, which had been subjected to treatment with hexamethyldisilazane in advance, by a spin coater. The substrate was dried on a hot plate at 100° C. for 90 seconds, followed by drying under heat at 190° C. for 240 seconds. Each of the photosensitive compositions was applied to the resulting substrate by a spin coater, followed by drying at 120° C. for 90 seconds, whereby a resist film of 0.50 μm was formed. The resist film was exposed using an ArF excimer laser stepper (produced by ISI, NA=0.6 (δ=0.75, ⅔ annular illumination)) through a mask. Immediately after exposure, the resist film was heated on a hot plate at 120° C. for 90 seconds. The resist film was developed in a 2.38% aqueous solution of tetramethylammonium hydroxide at 23° C. for 60 seconds, rinsed with pure water for 30 seconds and dried, whereby a resist line pattern was obtained. The defocus latitude of 0.13 μm in an exposure amount sufficient for reproducing 0.13 μm line and space (1/1) was observed.

(2) Evaluation of Sidelobe Margin

An antireflective coating DUV-42 (produced by Brewer Science, Inc.) was applied uniformly with a thickness of 600 Å to a silicon substrate, which had been subjected to treatment with hexamethyldisilazane in advance, by a spin coater. The substrate was dried on a hot plate at 100° C. for 90 seconds, followed by drying under heat at 190° C. for 240 seconds. Each of the photosensitive compositions was applied to the resulting substrate by a spin coater, followed by drying at 120° C. for 90 seconds, whereby a resist film of 0.50 μm was formed. The resist film was exposed using an ArF excimer laser stepper (produced by ISI, NA=0.6) through a halftone phase shift mask having a transmittance of 6%. Immediately after exposure, the resist film was heated on a hot plate at 120° C. for 90 seconds. The resist film was developed in a 2.38% aqueous solution of tetramethylammonium hydroxide at 23° C. for 60 seconds, rinsed with pure water for 30 seconds and dried, whereby contact hole patterns were obtained.

Taking an exposure amount sufficient for opening contact holes of 0.18 μm in size through a mask size of 0.20 μm at a duty ratio of 1:2 as the optimum exposure amount Eop, and from a relation thereof to an exposure amount Es at which sidelobe appears upon over-exposure in an amount greater than the optimum exposure amount in accordance with the equation described below, a sidelobe margin was etermined. The greater the value, the higher the sidelobe resistance.

Sidelobe Margin (%)=[(Es−Eop)/Eop]×100

(3) Evaluation of Particle

After the photosensitive composition prepared was allowed to stand at 4° C. for 1 week, a number of particles having a particle size of 0.2 μm or greater existing in the composition was counted by a particle counter produced by Rion Co., Ltd.

TABLE 3

|  | DOF (μm) | Sidelobe Margin (%) | Particle |
|---|---|---|---|
| Ex. 1 | 0.8 | 27 | <5 |
| Ex. 2 | 0.7 | 23 | <5 |
| Ex. 3 | 0.7 | 24 | <5 |
| Ex. 4 | 0.9 | 29 | <5 |
| Ex. 5 | 0.7 | 25 | <5 |
| Ex. 6 | 0.7 | 21 | <5 |
| Ex. 7 | 0.7 | 22 | <5 |
| Ex. 8 | 0.7 | 22 | <5 |
| Ex. 9 | 0.7 | 24 | <5 |
| Ex. 10 | 0.9 | 30 | <5 |
| Ex. 11 | 0.8 | 27 | <5 |
| Ex. 12 | 0.7 | 20 | <5 |
| Ex. 13 | 0.8 | 25 | <5 |
| Ex. 14 | 0.8 | 26 | <5 |
| Ex. 15 | 0.7 | 23 | <5 |
| Ex. 16 | 0.8 | 28 | <5 |
| Ex. 17 | 0.9 | 30 | <5 |
| Ex. 18 | 0.8 | 28 | <5 |
| Ex. 19 | 0.8 | 27 | <5 |
| Ex. 20 | 0.9 | 30 | <5 |
| Ex. 21 | 0.9 | 30 | <5 |
| Ex. 22 | 0.7 | 22 | <5 |
| Ex. 23 | 0.8 | 26 | <5 |
| Ex. 24 | 0.8 | 27 | <5 |
| Comp. Ex. 1 | 0.5 | 16 | <5 |
| Comp. Ex. 2 | 0.7 | 12 | 68 |

From the results shown in Table 3, it is apparent that the photosensitive compositions of Examples 1 to 24 exhibit a wide defocus latitude, excellent sidelobe resistance and a small number of particles generated and that the photosensitive compositions of Comparative Examples 1 and 2, on the contrary, are inferior to the photosensitive compositions of Examples in each of the defocus latitude, sidelobe resistance and generation of particles.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and score thereof.

What is claimed is:

1. A positive photosensitive composition comprising:

(A) a compound capable of generating a fluorine-substituted alkanesulfonic acid having 2 to 4 carbon atoms by irradiation of actinic rays or radiation, (B) a resin having a monocyclic or polycyclic alicyclic hydrocarbon structure and being decomposed by the action of an acid to increase solubility in an alkali developer, (C) a basic compound, and (D) a fluorine and/or silicon surfactant.

2. The positive photosensitive composition according to claim 1 further comprising (E) a mixture of a hydroxyl-containing solvent and a hydroxyl-free solvent.

3. The positive photosensitive composition according to claim 2, wherein the hydroxyl-containing solvent is selected from propylene glycol monomethyl ether and ethyl lactate.

4. The positive photosensitive composition according to claim 2, wherein the hydroxyl-free solvent is selected from a solvent containing a ketone group or an ester group.

5. The positive photosensitive composition according to claim 2, wherein the hydroxyl-free solvent is selected from propylene glycol monomethyl ether acetate, ethyl ethoxypropionate, 2-heptanone, γ-butyrolactone, cyclohexanone and butyl acetate.

6. The positive photosensitive composition according to claim 2, wherein the mixture of a hydroxyl-containing solvent and a hydroxyl-free solvent is a mixture of propylene glycol monomethyl ether and propylene glycol monomethyl ether acetate.

7. The positive photosensitive composition according to claim 1, wherein the resin (B) has a structural unit represented by the following formula (I) or (II):

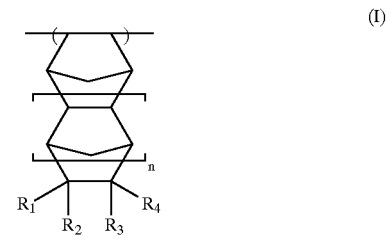

(I)

-continued

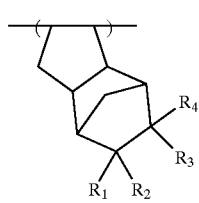
(II)

wherein $R_1$ to $R_4$ each independently represents a hydrogen atom, a carboxyl group, a hydroxyl group, a substituted or unsubstituted alkyl group, a substituted or unsubstituted alkoxycarbonyl group or a group having an acid decomposable group; and n stands for 0 or 1.

8. The positive photosensitive composition according to claim 1, wherein the resin (B) has a (meth)acrylate structural unit.

9. The positive photosensitive composition according to claim 1, wherein the basic compound (C) is a compound having a structure represented by the following formulas (A) to (E):

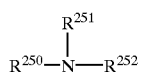
(A)

wherein, $R^{250}$, $R^{251}$ and $R^{252}$ each independently represents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms, or $R^{250}$ and $R^{251}$ may be bonded to each other to form a ring;

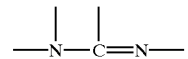
(B)

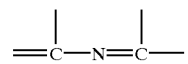
(C)

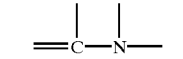
(D)

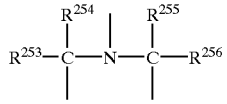
(E)

wherein, $R^{253}$, $R^{254}$, $R^{255}$ and $R^{256}$ each independently represents an alkyl group having 1 to 6 carbon atoms.

10. The positive photosensitive composition according to claim 1, wherein the basic compound (C) is a compound having a structure selected from an imidazole structure, a diazabicyclo structure, an onium hydroxide structure and an onium carboxylate structure.

11. The positive photosensitive composition according to claim 1, wherein an onium of the onium hydroxide structure is selected from sulfonium, iodonium and ammonium.

12. The positive photosensitive composition according to claim 1, wherein an onium of the onium carboxylate structure is selected from sulfonium, iodonium and ammonium.

* * * * *